United States Patent [19]
Dirksen et al.

[11] Patent Number: 5,917,604
[45] Date of Patent: Jun. 29, 1999

[54] ALIGNMENT DEVICE AND LITHOGRAPHIC APPARATUS PROVIDED WITH SUCH A DEVICE

[75] Inventors: Peter Dirksen; Jan E. Van Der Werf; Manfred G. Tenner, all of Eindhoven, Netherlands

[73] Assignee: U.S. Philips Corporation, New York, N.Y.

[21] Appl. No.: 08/818,143

[22] Filed: Mar. 13, 1997

[30] Foreign Application Priority Data

Mar. 15, 1996 [EP] European Pat. Off. .............. 96200725

[51] Int. Cl.$^6$ .................................................. G01B 11/00

[52] U.S. Cl. ............................................................ 356/401

[58] Field of Search ................................. 356/399–401, 356/356; 250/548; 355/53

[56] References Cited

U.S. PATENT DOCUMENTS

| | | |
|---|---|---|
| 4,251,160 | 2/1981 | Bouwhuis et al. . |
| 4,778,275 | 10/1988 | Van Den Brink et al. . |
| 5,100,237 | 3/1992 | Wittekoek et al. . |

*Primary Examiner*—K P Hantis
*Attorney, Agent, or Firm*—Daniel E. Tierney; Norman N. Spain

[57] ABSTRACT

A device is described for aligning a first object provided with a first alignment mark (P) with respect to a second object provided with a second alignment mark (M), which marks have a periodical structure and are imaged onto each other. By selecting beam portions from the radiation from the first alignment mark (P) with the aid of an order diaphragm (55'), which beam portions are deflected through larger angles, the sensitivity of the device to errors can be decreased. Such a device may be used to great advantage in a lithographic apparatus.

22 Claims, 12 Drawing Sheets

//  5,917,604

ALIGNMENT DEVICE AND LITHOGRAPHIC APPARATUS PROVIDED WITH SUCH A DEVICE

BACKGROUND OF THE INVENTION

The invention relates to an alignment device for aligning a first object, which is provided with at least a first alignment mark, with respect to a second object which is provided with at least a second alignment mark, said device comprising a radiation source for supplying at least an alignment beam, a first object holder, a second object holder, a projection system for imaging a first alignment mark and a second alignment mark onto each other, and a radiation-sensitive detection system arranged in the path of selected alignment beam portions by which these alignment marks are imaged onto each other alignment marks, the output signal of said radiation-sensitive detection system being a measure of the mutual position of these alignment marks.

The invention also relates to a lithographic apparatus in which such an alignment device is used as a precision alignment device or as a pre-alignment device. The mask used in such an apparatus is provided with at least a mask alignment mark and the substrate is provided with at least a substrate alignment mark.

The selected alignment beam portions are those portions of the alignment beam which are effectively used to image the first alignment mark on the second alignment mark. If the alignment marks are diffraction gratings, the selected alignment beam portions are the beam portions diffracted in given orders by the alignment marks.

An optical lithographic apparatus for repetitive and reduced projection of a mask pattern, for example, the pattern of an integrated circuit (IC) on one and the same substrate, is described in U.S. Pat. No. 4,778,275, in which the mask pattern and the substrate are moved with respect to each other between two successive illuminations, for example, along two mutually perpendicular directions in a plane parallel to the substrate plane and the mask plane.

Integrated circuits are manufactured by means of diffusion and masking techniques. A number of masks with different mask patterns are consecutively imaged on one and the same location on a semiconductor substrate. Between the consecutive imaging steps on the same locations, the substrate must undergo the desired physical and chemical changes. To this end, the substrate must be removed from the apparatus after it has been illuminated with a mask pattern, and, after it has undergone the desired process steps, it must be placed in the apparatus again in the same position so as to illuminate it with a second mask pattern, and so forth, while it must be ensured that the projections of the second mask pattern and of the subsequent mask patterns are positioned accurately with respect to the substrate.

Diffusion and masking techniques can also be used in the manufacture of other structures having detail dimensions of the order of micrometers, for example, structures of integrated optical systems or guiding and detection patterns of magnetic domain memories and structures of liquid crystal display panels. Also in the manufacture of these structures, the mask patterns must be aligned very accurately with respect to a substrate.

In view of the large number of electronic components per unit of surface area of the substrate and the resultant small dimensions of these components, increasingly stricter requirements are imposed on the accuracy with which integrated circuits are manufactured. The position where the consecutive masks are projected on the substrate must therefore be established more and more accurately.

In order to be able to realize the desired, very precise positioning accuracy, within several tenths of one micrometer in the apparatus according to U.S. Pat. No. 4,778,275, of the projection of the mask pattern with respect to the substrate, this apparatus comprises a device for aligning the substrate with respect to the mask pattern with which an alignment mark provided in the substrate is imaged on an alignment mark provided in the mask. If the image of the substrate alignment mark accurately coincides with the mask alignment mark, the substrate is correctly aligned with respect to the mask pattern. The main element for imaging the substrate mark on the mask mark is constituted by the projection lens system, or imaging system with which the mask pattern is imaged on the substrate.

The alignment device described in U.S. Pat. No. 4,778,275 has hitherto worked to full satisfaction, but it is to be expected that with the use of novel technologies in IC manufacture and with decreasing detail sizes, or line widths, of the IC patterns, the alignment device may present problems relating to its reliability and accuracy.

In the manufacture of new-generation ICs with smaller line widths, stricter requirements must be imposed on the planeness of the substrate due to the required higher numerical aperture (NA) of the projection lens system upon a decreasing line width. The depth of focus of this system decreases as the NA increases. Since there will be some curvature of the image field at the desired relatively large image field of the projection lens system, there is substantially no room for unevennesses of the substrate. To obtain the desired evenness of the substrate, it may be polished, in between two illuminations, by means of the chemical mechanical polishing (CMP) process. This process is found to cause an asymmetrical distortion in a substrate alignment mark implemented as a grating, so that alignment errors may occur.

The manufacturing process for new-generation ICs is becoming more and more complicated: the number of process steps and the number of process layers on the substrate increase more and more. Some of these layers introduce asymmetries in a grating-shaped alignment mark and thus cause alignment errors.

Further alignment errors may be caused by the mask, or reticle. Due to false reflections by the mask and by optical elements of the alignment device, unwanted phase differences in the alignment radiation are produced. If this radiation is coherent, such as the conventional HeNe laser radiation, not only the desired image of the substrate alignment mark is produced at the location of the mask alignment mark, but also an extra, or "ghost" image is produced, while, with a varying thickness of the substrate of the mask alignment mark, the position of this ghost image with respect to the desired image is dependent on the position where the alignment radiation is incident on this substrate. This effect, which may be referred to as the RICO (Reticle Induced Coherence Offset) effect, may cause alignment errors.

If a polarization-sensitive optical system is used in the alignment device, as in the device described in U.S. Pat. No. 4,778,275, further alignment errors may be produced because the substrate of a conventional IC mask consists of quartz which has some birefringence, be it a small birefringence. This birefringence causes an offset of the image of the substrate alignment mark with respect to the alignment mark. Said birefringence is not constant throughout the mask substrate surface but has a position-dependent variation. If more alignment marks spread on the mask surface area used, as is the case, for example, in the step-and-scan apparatuses, these alignment errors can no longer be compensated by, for example, an accurate correction of the state of polarization of the alignment radiation.

SUMMARY OF THE INVENTION

It is an object of the invention to provide an alignment device in which the influence of the above-mentioned effects on the alignment signal is reduced considerably, so that the device will be more accurate and more reliable than the known device. To this end, the device according to the invention is characterized in that in the path of the alignment radiation between a first alignment mark and a second alignment mark an order diaprhagm is arranged, that is provided with radiation-transmissive portions which transmit only those alignment beam portions to the second alignment mark which are diffracted by the first alignment mark in one of the even orders.

The invention is based on the recognition that said alignment errors are proportional to the period of the alignment marks and that these errors can thus be reduced by reducing this period, and on the further recognition that a periodical structure with a period p can be simulated by a periodical structure with a period 2n.p, by using for imaging only the radiation portions diffracted by this structure in the nth order, with n being an integer which is at least equal to 2. To this end, an order diaphragm is used which is provided with radiation-transmissive portions only at those positions where thesen nth order radiation portions are incident on this diaphragm. The transmissive portions may be apertures or areas of radiation-transmissive material in an opaque plate. Since the alignment marks effectively have a smaller period, the alignment device according to the invention is not only more reliable but also considerably more accurate than known alignment devices.

The device according to the invention is preferably further characterized in that the order diaphragm is also provided with radiation-transmissive portions which transmit alignment beam portions diffracted in the first order by a first alignment mark.

As described in U.S. Pat. No. 4,251,160, in which the principle of alignment by means of grating marks and a first-order diaphragm is disclosed, the use of only the radiation diffracted in the first order by a grating mark yields an image of this mark having a period which is half the period of the grating mark itself. Consequently, the alignment accuracy is twice as great as in the case where also the zero-order and the higher order diffracted radiation is used. By providing the order diaphragm also with apertures for the first-order diffracted radiation in the device according to the invention, the same alignment device can be used both for alignment with a higher accuracy in accordance with the novel method and alignment in accordance with the known method. The novel alignment device is thereby rendered compatible for the known alignment marks.

To prevent radiation diffracted by a first and a second alignment mark in other than the desired orders from reaching the detection system, the alignment device is preferably further characterized in that a further order diaphragm provided with radiation-transmissive portions is arranged in the path of the alignment beam radiation between a alignment mark and the detection system, said radiation-transmissive portions transmitting only alignment beam portions to the detection system which are diffracted by the first alignment mark, in one of the even orders and by the second alignment mark in other orders which are lower than said even order.

If this alignment device is further characterized in that the further order diaphragm is also provided with radiation-transmissive portions transmitting only alignment beam portions which are diffracted in the first order by the first alignment mark, it is also suitable for use in combination with known alignment marks.

A preferred embodiment of the alignment device according to the invention is further characterized in that said even order is the fourth order.

It has been found that the novel alignment device yields an optimum result if the alignment beam portions diffracted in the fourth order by the first alignment mark are selected for generating the alignment signal.

This embodiment may be further characterized in that said other orders are the +2 order and the −2 order.

After the beam portions diffracted in the fourth order by the first alignment mark have passed the second alignment mark, they form a beam whose chief ray is perpendicular to the second alignment mark.

Alternatively, this embodiment may be further characterized in that said other orders are a first order and a third order.

After the beam portions diffracted in the fourth order by the first alignment mark have passed the second alignment mark, they now also form a beam, but this time the chief ray of this beam extends at an angle to the normal on the second alignment mark.

The alignment device in which the fourth-order diffracted alignment radiation is used and in which the first alignment mark has a grating structure with a grating period p, may be further characterized in that, per grating period, this alignment mark comprises at least a grating strip having a width of ⅛.p.

It is thereby ensured that a sufficient portion of the radiation incident on this mark is diffracted in the fourth order.

To increase this portion and amplify the alignment signal obtained, the device is further preferably characterized in that the first alignment mark comprises four grating strips per grating period, while the mutual distance between the first and the second grating strip and that between the third and the fourth grating strip is equal to ⅛.p, and the mutual distance between the second and the third grating strip is equal to ¼.p.

Alternatively, the alignment device may be characterized in that the first alignment mark has two grating strips per grating period, which strips are mutually spaced apart by ⅝.p.

This alignment mark does not only diffract the alignment radiation in the fourth order but also in the first order, so that both the novel, precision alignment and the known, global alignment can be realized with the alignment device.

If the alignment device is further characterized in that each alignment mark has two grating portions, in which the direction of the grating strips of the first portion is perpendicular to that of the grating strips of the second portion, it is possible to align in two mutually perpendicular directions with this device.

The invention also relates to an apparatus for projecting a mask pattern, present in a mask, on a substrate, which apparatus successively comprises a radiation source unit for supplying a projection beam, a mask holder, a projection system and a substrate holder, and is further provided with a device for aligning the mask with respect to the substrate. This apparatus is characterized in that the alignment device is a device as described above, while the substrate and the mask constitute the two objects for the alignment device.

Such an apparatus, which is also referred to as lithographic projection apparatus, may be used in the manufacture of ICs, but also of integrated, or planar optical systems, liquid crystalline picture display panels, magnetic domain memories, etc.

The most customary embodiment of this apparatus is further characterized in that the projection beam is a beam of electromagnetic radiation and the projection system is an optical lens system, and in that the imaging system of the alignment device is constituted by the projection lens system.

However, the projection beam may also be a charged-particle beam such as an ion beam, an electron beam or a beam of X-ray radiation, for which the projection system is adapted to the type of radiation. For example, if the projection beam is an electron beam, the projection system will be an electron lens system. This projection system can then no longer be used as an imaging system for the alignment device.

The invention may also be used in a lithographic apparatus which does not only comprise a precision alignment device but also a pre-alignment station for pre-aligning the substrate, and is provided with transport means for transporting the substrate under the projection system and the mask, while maintaining the realized pre-alignment. This apparatus is then characterized in that the pre-alignment station is provided with an alignment device as described hereinbefore.

In this field of application, the alignment device may be used as a calibration means. To this end, the alignment device is implemented in such a way that an alignment signal coming from the first-order diffracted alignment radiation and an alignment signal coming from, for example the fourth-order diffracted alignment radiation can be obtained with this device. These signals can be compared with each other and, with the result of this comparison, the precision alignment device operating with first-order diffracted alignment radiation, can be calibrated.

A preferred embodiment of the optical lithographic apparatus according to the invention is further characterized in that the paths of the alignment beam portions selected by the order diaphragm and in the projection lens system incorporate correction elements having a dimension which is considerably smaller than the diameter of the projection lens system in the plane of said correction elements, are arranged each correction element only deflecting and focusing the associated alignment beam portion.

When the projection lens system optimized for the short-wave projection radiation, for example, deep UV radiation is used for imaging a first alignment mark on a second alignment mark, imaging errors are produced, namely a magnification error and a focus error, because the alignment radiation has a considerably longer wavelength, for example 633 nm. These imaging errors, and the alignment signal error caused thereby can be eliminated by said correction elements in the manner as described in European Patent application No. 0 393 775 for a correction element for the first-order beam portions.

The correction elements are arranged at such a height in the projection lens system that, on the one hand, in the plane of the correction elements the alignment beam portions with the selected orders are sufficiently separated to be able to influence these beam portions separately and, on the other hand, these correction elements have a negligible influence on the projection beam and the mask image formed with this beam. Under circumstances, the correction elements may be opaque to the projection beam radiation. Then it is prevented that these elements introduce phase differences in the projection beam.

A preferred embodiment of the apparatus is characterized in that the correction elements are arranged in the Fourier plane of the projection lens system.

The projection lens system is a composite lens system having a large number of lens elements which may be considered to be arranged in a first lens group and a second lens group. The Fourier plane is between these two lens groups. The first lens group constitutes a Fourier transform of an object, in this case an alignment mark, while the second lens group converts this Fourier transform into an image of the object. The alignment beam portions with the selected diffraction orders are focused and separated from each other in the Fourier plane.

The apparatus is preferably further characterized in that the order diaphragm has a dichroic layer which is transmissive to the projection beam radiation and non-transmissive to the alignment beam radiation, with the exception of said radiation-transmissive portions, and in that the correction elements are arranged in said portions.

The correction elements are then integrated with the further order diaphragm so that a robust and compact assembly is obtained.

Since each correction element influences the direction of the rays passing through them and hence directly displaces the position of the point where these rays are combined, these correction elements as such are already very effective. Moreover, since the correction elements are arranged at a relatively large distance from the second alignment mark, their effectiveness is enhanced considerably. The optical strength of these elements can thus remain limited, so that they are relatively insensitive to mechanical and thermal instabilities.

The correction elements may be diffractive elements but are preferably constituted by refractive elements. A refractive correction element may have various shapes and consist of, for example a double optical wedge.

A preferred embodiment of the apparatus is, however, characterized in that the correction elements are lenses.

With such a correction lens it is not only possible to correct the focal point of the associated alignment beam portion, but the magnification with which an alignment mark is imaged can also be corrected.

The apparatus according to the invention may also be corrected for other alignment errors. It has been found that since, for example in the case where a substrate alignment mark is projected on a mask alignment mark, using, for example, alignment beam portions diffracted in the fourth order, the axis of symmetry of these alignment beam portions is not perpendicular to the mask plate, extra phase differences and hence extra intensity variations, which are independent of the alignment, may be produced in the radiation which is incident on the detection system. As a result, an incorrect alignment signal may be obtained. These extra intensity variations are produced because portions of the double order sub-beams, i.e. sub-beams which are diffracted both by the substrate alignment mark and by the mask alignment mark, are once more reflected by a mask plate surface towards the mask alignment mark and are subsequently reflected by this mark and diffracted in the direction of the double order sub-beams. These portions, which may be designated as three-fold order sub-beams, traverse different path lengths in the mask plate and exhibit a mutual phase difference at the location of the detection system so that they influence the output signal of this detection system.

Also in alignment devices in which the beam portions reflected in the mask plate are not again incident on the mask alignment mark, or in which marks other than diffraction gratings are used as alignment marks, the above-mentioned phase difference, and hence an erroneous alignment signal, may be produced.

Since the above-mentioned phase difference is dependent on the thickness of the mask plate, the alignment of a first mask plate with respect to a substrate will differ from the alignment of a second mask plate with respect to the same substrate when using mask plates of different thicknesses in one and the same apparatus. The extent to which said phase difference leads to an alignment error is dependent on the reflection coefficient of the mask plate, so that the use, in one and the same apparatus, of mask plates having different reflection coefficients in turn leads to a difference between the alignment of a first mask plate and that of a second mask plate with respect to the same substrate.

Finally, said phase difference is dependent on the angle between the normal on the mask plate and the axis of symmetry of the selected alignment beam portions, which angle may differ from apparatus to apparatus. When several apparatuses are used for consecutive process steps of one and the same substrate, the alignment of the substrate with respect to a mask may differ, even if the mask plates used have the same thickness and reflection coefficient. The differences in the extent of alignment could then be corrected in the apparatuses themselves. However, such a correction is principally impossible if the mask plates used have different thicknesses and/or reflection coefficients.

The axis of symmetry of the selected alignment beam portions is an imaginary axis and not a physical axis. If the alignment beam portions diffracted in the fourth order by the substrate alignment mark are selected, the axis of symmetry is located symmetrically with respect to the chief rays of the beam portions and coincides, for example, with the chief ray of the fictitious zero-order sub-beam which does not take part in the projection.

An embodiment of the apparatus according to the invention, in which said unwanted phase differences in the alignment radiation are prevented, is characterized in that a radiation deflection element is arranged in the vicinity of a mask alignment mark for directing the axis of symmetry of the selected alignment beam portions principally perpendicularly to the plane of the mask plate, said radiation deflection element being considerably smaller than the cross-section of the projection beam in the plane of said plate.

It is true that portions of the double order sub-beams may once more be reflected towards the second alignment mark so that three-fold order sub-beams deflected in opposite directions are produced. However, the deflection element ensures that the last-mentioned sub-beams traverse the same path lengths in the plate of the second alignment mark so that no extra phase differences occur between these sub-beams.

The perpendicular directing of the axis of symmetry is understood to mean that the beam portions themselves, for example, the beam portions diffracted in the +4 order and the −4 order by the first alignment mark are directed in such a way that the axis of symmetry of these portions, corresponding to the chief ray of the fictitious zero-order sub-beam, is perpendicular to the second alignment mark.

The deflection element is arranged as close as possible to the mask alignment mark so that the narrow beam portions overlap each other satisfactorily at said mark and consequently the surface of this element may be small. This element will not affect the projection beam. Moreover, the deflection element is only to realize a relatively small direction correction so that it only needs to have a small thickness. Consequently, it is not necessary to impose strict requirements on the mechanical and thermal stability of this element.

In accordance with a further characteristic feature, the deflection element is constituted by a wedge-shaped body of a material which is transparent to the alignment beam.

Other deflection elements such as, for example, a mirror may be used instead of a wedge-shaped element. However, the requirements of stability to be imposed on such a mirror must be stricter than those imposed on the stability of a wedge-shaped element.

As described in U.S. Pat. No. 4,778,275, an apparatus for imaging a mask pattern on a substrate preferably comprises, in addition to said device for aligning a first mask alignment mark with respect to a substrate alignment mark, a second analog device for aligning a second mask alignment mark with respect to a substrate alignment mark by means of a second alignment beam. The relative angle orientation of the mask pattern and the substrate can then be established directly and optically, and the magnification with which the projection lens system images the mask pattern on the substrate can be determined. Such an apparatus, in which the invention is used, is characterized in that the correction elements for the first alignment device are also the correction elements for the second alignment device.

This apparatus may be further characterized in that a second deflection element is arranged in the path of the second alignment beam and in the vicinity of a second mask alignment mark.

There are various embodiments of the apparatus according to the invention, which embodiments are distinguished from one another in the way in which the substrate alignment mark and the mask alignment mark are imaged on each other and possibly on a reference alignment mark.

A first embodiment is characterized in that the first alignment mark is a substrate alignment mark and the second alignment mark is a mask alignment mark.

A second embodiment is characterized in that the first alignment mark is a mask alignment mark and the second alignment mark is a substrate alignment mark.

A preferred embodiment of the apparatus is further characterized in that a substrate alignment mark is constituted by a phase diffraction grating and a mask alignment mark is constituted by an amplitude diffraction grating.

As described in U.S. Pat. No. 4,251,160, periodical gratings as compared with other alignment marks have the advantage that when measuring position errors, averaging over the gratings occurs. As a result it is possible to align accurately. The substrate gratings are only to be provided once for the entire manufacturing cycle of an integrated circuit and do not have to be provided in each newly provided layer. As compared with amplitude gratings, phase gratings on the substrate have the advantage that they remain well "visible".

The preferred embodiment of the apparatus according to the invention may be further characterized in that means controlled by periodical signals are arranged in the radiation path of an alignment beam for periodically displacing with respect to each other a second alignment mark and the image on this mark of a first alignment mark observed by the detection system. In the case of grating marks, the displacement is of the order of half a period of the second alignment mark.

Said means may be constituted by a drive member for the second alignment mark so that this alignment mark is periodically moved, or by a polarization modulator in combination with polarization-sensitive elements which ensure that the image of the first alignment mark is effectively oscillated across a second alignment mark. By periodically displacing the image of the first mark observed by the detection system with respect to the second mark, a dynamic alignment signal is obtained and the accuracy and sensitivity of the apparatus are considerably improved. The latter is important if the substrate alignment marks only reflect weakly.

DETAILED DESCRIPTION OF THE INVENTION

Figure 1:
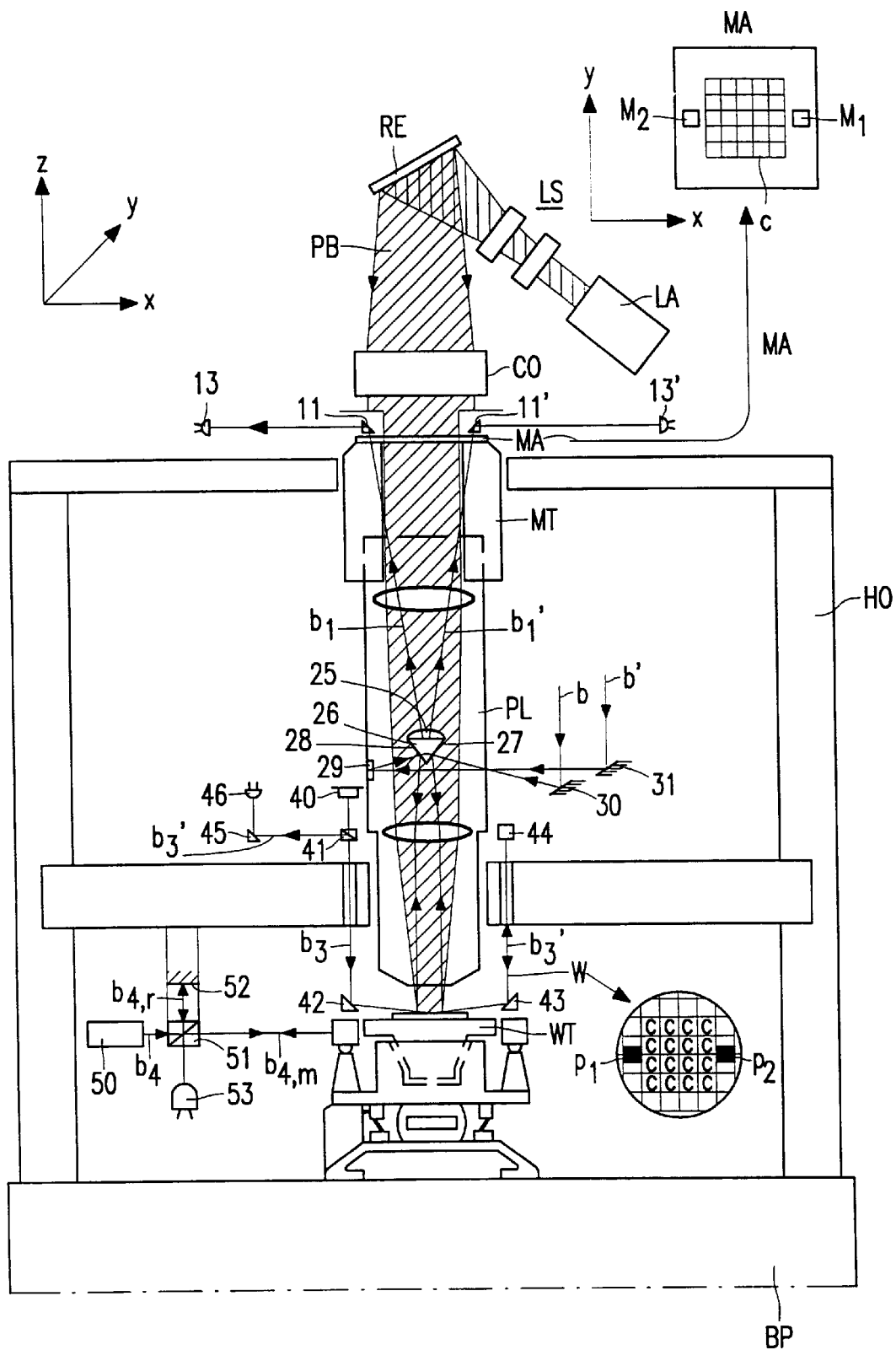
FIG. 1 shows an embodiment of an apparatus for repetitive imaging of a mask pattern on a substrate.

FIG. 1 shows an embodiment of an apparatus for repetitive imaging of a mask pattern on a substrate. The main components of this apparatus are a projection column, in which a mask pattern C to be imaged is to be arranged and a movable substrate table WT with which the substrate can be positioned with respect to the mask pattern C.

The apparatus also incorporates an illumination system which comprises, for example, a laser LA, for example a krypton-fluoride laser, a lens system LS, a mirror RE and a condensor lens CO. The projection beam PB supplied by the illumination unit illuminates the mask pattern C present in the mask MA which is arranged on a mask table MT.

The beam PB passing through the mask pattern C traverses a projection lens system PL arranged in the projection column and shown only diagrammatically, which system forms an image of the pattern C on the substrate W. The projection lens system has, for example a magnification $M=\frac{1}{5}$, a numerical aperture N.A.=0.48 and a diffraction-limited image field with a diameter of 21 mm. These numbers are arbitrary and may vary with every new generation of the projection apparatus.

The substrate W is arranged on a substrate table WT supported in, for example, air bearings. The projection lens system PL and the substrate table WT are arranged in a housing HO which is closed at its lower side by a base plate BP of, for example granite and at its upper side by the mask table MT.

As is shown in the top right-hand corner in FIG. 1, the mask MA has two alignment marks $M_1$ and $M_2$. These marks preferably consist of diffraction gratings, but they may be alternatively formed by other periodical structures. The alignment marks are preferably two-dimensional, i.e. they extend in two mutually perpendicular directions, the X and Y directions in FIG. 1. The substrate W, for example, a semiconductor substrate on which the pattern C must be projected side by side for a number of times, comprises a plurality of alignment marks, preferably also two-dimensional diffraction gratings, two of which, $P_1$ and $P_2$, are shown in FIG. 1. The marks $P_1$ and $P_2$ are located outside the regions on the substrate W where the projections of the pattern C must be formed. Preferably, the grating marks $P_1$ and $P_2$ are in the form of phase gratings and the grating marks $M_1$ and $M_2$ are in the form of amplitude gratings.

Figure 2:
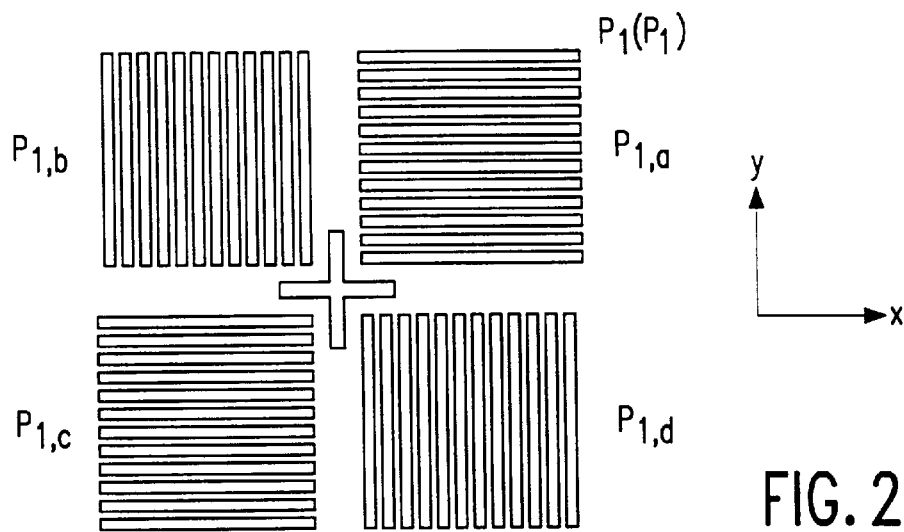
FIG. 2 shows a known embodiment of an alignment mark in the form of a two-dimensional grating.

FIG. 2 shows an embodiment of one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two other sub-gratings, $P_{1,a}$ and $P_{1,c}$, are used for alignment in the Y direction. The two sub-gratings $P_{1,b}$ and $P_{1,c}$ have a grating period of, for example, 16 $\mu$m and the sub-gratings $P_{1,a}$ and $P_{1,d}$ have a grating period of, for example, 17.6 $\mu$m. Each sub-grating may have a dimension of, for example, 200×200 $\mu$m. An alignment accuracy which, in principle, is less than 0.1 $\mu$m can be achieved with these gratings and a suitable optical system. Different grating periods have been chosen so as to increase the capture range of the alignment device.

FIG. 1 shows a first embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$. The beam b is reflected to the reflective surface 27 of a prism 26 by means of a reflecting element 30, for example, a mirror. The surface 27 reflects the beam b to the substrate alignment mark $P_2$ which sends a part of the radiation as beam $b_1$ to the associated mask alignment mark $M_2$ where an image of the mark $P_2$ is formed. A reflecting element 11, for example, a prism which directs the radiation passed by the mark $M_2$ to a radiation-sensitive detector 13 is arranged above the mark $M_2$.

The second alignment beam b' is reflected to a reflector 29 in the projection lens system PL by a mirror 31. This reflector 29 sends the beam b' to a second reflecting surface 28 of the prism 26, which surface directs the beam b' on the substrate alignment mark $P_1$. This mark reflects a part of the radiation of the beam b' as beam $b_1$' to the mask alignment mark $M_1$ where an image of the mark $P_1$ is formed. The radiation of the beam $b_1$' passing through the mark $M_1$ is directed towards a radiation-sensitive detector 13 by a reflector 11.

Figure 3:
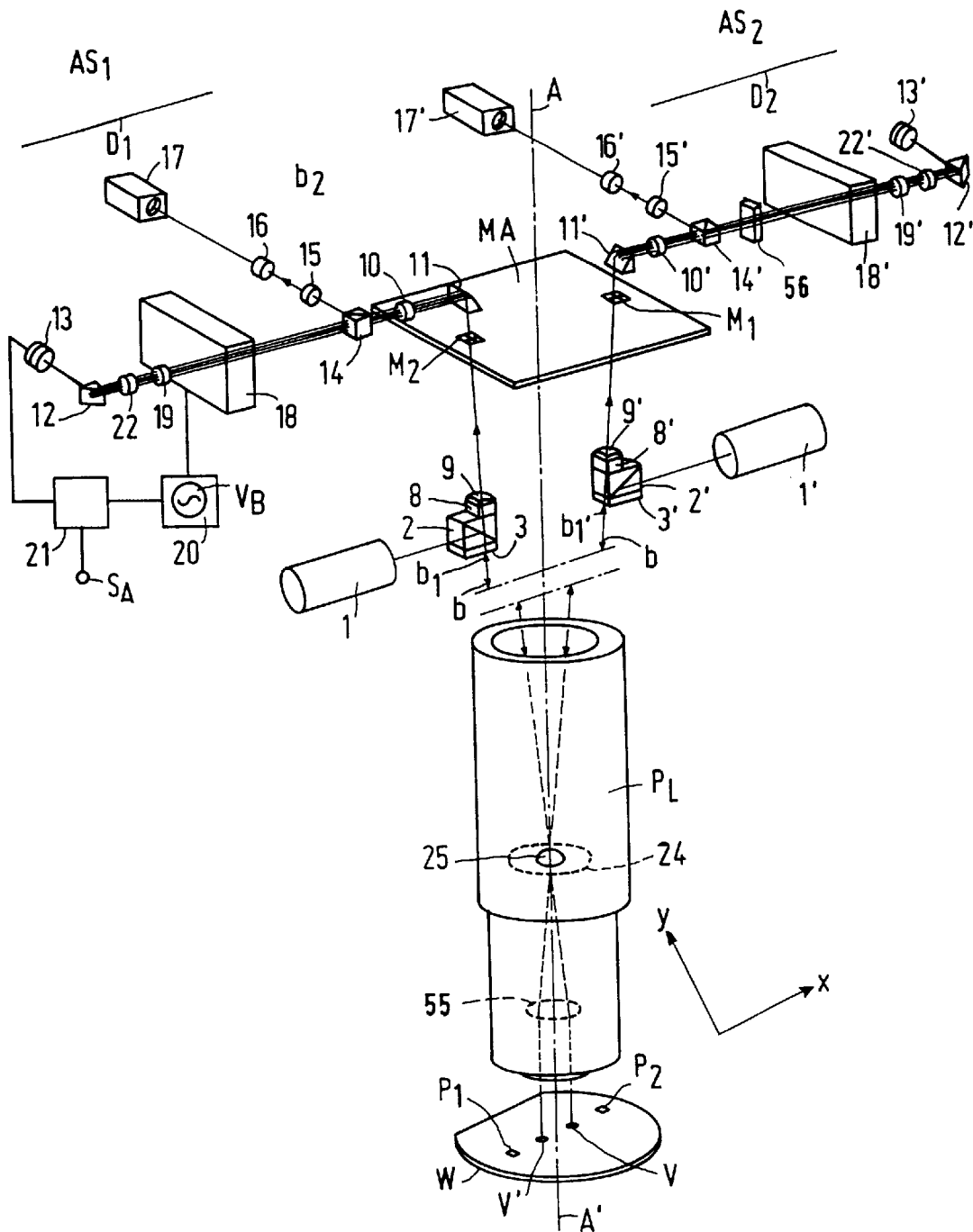
FIG. 3 shows a first embodiment of an apparatus according to the invention comprising two alignment devices.

The operation of the double alignment device will be further described with reference to FIG. 3 showing a further embodiment of such a device.

The projection apparatus further comprises a focus error detection system for determining a deviation between the focal plane of the projection lens system PL and the surface of the substrate W so that this deviation can be corrected, for example, by moving the projection lens system along its axis. This system may be constituted by the elements 40, 41, 42, 43, 44, 45 and 46 which are arranged in a holder (not shown) which is fixedly connected to the projection lens system. The reference numeral 40 denotes a radiation source, for example, a diode laser which emits a focusing beam $b_3$. This beam is directed onto the substrate at a very small angle by a reflecting prism 42. The beam reflected by the substrate is directed towards a retro-reflector 44 by the prism 43. The element 44 reflects the beam in itself so that this beam ($b_3$') once more traverses the same path through reflections on the prism 43, the substrate W and the prism 42. The beam $b_3$' reaches a radiation-sensitive detection system 46 via a partly reflecting element 41 and a reflecting element 45. This detection system comprises, for example, a position-dependent detector or two separate detectors. The position of the radiation spot formed by the beam $b_3$' on this system is dependent on the extent to which the focal plane of the projection lens system coincides with the plane of the substrate W. For an extensive description of the focus error detection system, reference is made to U.S. Pat. No. 4,356,392.

In order to determine the X and Y positions of the substrate table WT very accurately, the projection apparatus comprises a multiple axis interferometer system, of which only a single axis sub-system is diagrammatically shown in FIG. 1 by means of a radiation source 50 in the form of a laser, a beam splitter 51, a fixedly arranged reflecting element 52 and a detection system 53. The beam $b_4$ emitted by the source 50 is split by the beam splitter into a measuring beam $b_{4,m}$ and a reference beam $b_{4,r}$. The measuring beam reaches a reflecting side face of the substrate table and preferably a similar face of a substrate holder which forms part of the table and on which the substrate is rigidly secured. The beam splitter 51 combines the measuring beam reflected by this face with the reference beam reflected by the reflecting element 52 so as to form an interference pattern at the location of the detection system 53. The composite interferometer system may be implemented as described in U.S. Pat. No. 4,251,160 and then it operates with two beams. Instead of this two-axis interferometer system, a three-axis system as described in U.S. Pat. No. 4,737,823, or a five-axis interferometer system as described in the European patent application 0 498 499 may be used.

By using the substrate table position detection device in the form of an interferometer system, the positions of, and the mutual distances between the alignment marks $P_1$ and $P_2$ and $M_1$ and $M_2$ can be related during alignment to a system of coordinates defined by the interferometer system. It is then not necessary to refer to a frame of the projection apparatus or to a component of this frame, so that variations in this frame due to, for example, temperature variations, mechanical creep and the like do not have any influence on the measurements.

FIG. 3 shows the principle of the double alignment device with reference to an embodiment which is distinguished from that in FIG. 1 by the different manner of coupling the alignment beams b and b' into the projection lens system. The apparatus comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being distinguished from those of the system $AS_1$ by their primed notation.

The structure of the system $AS_1$ as well as the way in which the mutual position of the mask mark $M_2$ and, for example, the substrate mark $P_2$ is determined will now be described.

The alignment system $AS_1$ comprises a radiation source 1, for example, a helium-neon laser which emits an alignment beam b. This beam is reflected towards the substrate W by a beam splitter 2. The beam splitter may be a partially transparent mirror or a partially transparent prism, but it is preferably a polarization-sensitive splitting prism which is succeeded by a quarter-wavelength plate 3. The projection lens system PL focuses the beam b to a small radiation spot V having a diameter of the order of 1 mm on the substrate W. This substrate reflects a part of the beam as beam $b_1$ in the direction of the mask M. The beam $b_1$ traverses the projection lens system PL, which system images the radiation spot V on the mask. Before the substrate is arranged in the illumination apparatus, it has been prealigned in a prealigning station coupled to the apparatus, for example, the station described in European Patent Application no. 0,164,165, so that the radiation spot V is located on the substrate mark $P_2$. This mark is then imaged by the beam $b_1$ on the mask mark $M_2$. Taking the magnification M of the projection lens system into account, the dimension of the mask mark $M_2$ is adapted to that of the substrate mark $P_2$ so that the image of the mark $P_2$ accurately coincides with the mark $M_2$ if the two marks are mutually positioned in the correct manner.

On its path to and from the substrate W, the beam b and $b_1$ has traversed twice the quarter-wavelength plate 3 whose optical axis extends at an angle of 45° to the direction of polarization of the linearly polarized beam b coming from the source 1. The beam $b_1$ passing through the plate 3 then has a direction of polarization which is rotated 90° with respect to the beam b, so that the beam $b_1$ is passed by the polarization splitting prism 2. The use of the polarization splitting prism in combination with the quarter-wavelength plate provides the advantage of a minimum radiation loss when coupling the alignment beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of these detectors are a measure of the coincidence of the mark $M_2$ with the image of the substrate mark $P_2$. These signals may be processed electronically and used for moving the mask with respect to the substrate by means of driving systems (not shown) so that the image of the mark $P_2$ coincides with the mark $M_2$. Thus, an automatic alignment device is obtained.

A beam splitter 14 in the form of, for example, a partially transparent prism may be arranged between the prism 11 and the detector 13, which beam splitter splits a part of the beam $b_1$ as beam $b_2$. The split beam $b_2$ is then incident via, for example, two lenses 15 and 16 on a television camera 17 which is coupled to a monitor (not shown) on which the alignment marks $P_2$ and $M_2$ are visible to an operator of the illumination apparatus. This operator can then ascertain whether the two marks coincide and, if necessary, he may move the substrate W by means of manipulators so as to cause the marks to coincide.

Analogously as described hereinbefore for the marks $M_2$ and $P_2$, the marks $M_1$ and $P_2$ and the marks $M_1$ and $P_1$, respectively, can be aligned with respect to each other. The alignment system $AS_2$ is used for the two last-mentioned alignments.

For details about the alignment procedure by means of the alignment systems reference is made to U.S. Pat. No. 4,778,275.

The alignment marks $P_1$ and $P_2$ in the form of gratings, or other diffraction elements split the alignment beams incident thereon into a non-deflected zero-order sub-beam and a plurality of (deflected) first-order and higher order sub-beams. Of these sub-beams, only those having the same order number are selected in the alignment device so as to image a substrate alignment mark on a mask alignment mark. For the selection of the sub-beams, an order diaphragm is arranged in the projection lens system at a position where the sub-beams diffracted in the different diffraction orders are spatially separated to a sufficient extent, for example, in the Fourier plane of the projection lens system. This order diaphragm is diagrammatically indicated by means of the reference numeral 55 in FIG. 3 and consists of a plate which is opaque to the alignment radiation and has a plurality of radiation-transmissive areas or apertures. If the alignment mark comprises a two-dimensional grating structure, the plate has four apertures for the sub-beams diffracted in the relevant order in the plus and minus X direction and the plus and minus Y direction. Moreover, an additional order diaphragm 56 improving the selection of the desired order is preferably arranged in the detection branch, i.e. the part of the radiation path from the mask alignment mark to the detector 13, 13'.

In the devices described in U.S. Pat. Nos. 4,251,160 and 4,778,275, the first-order diffracted sub-beams are selected. The sub-beams incident on a mask alignment mark are split by this mark into different diffraction orders so that a number of sub-beams of double diffraction orders are produced which are directed towards the associated radiation-sensitive detection system 13 or 13' and interfere with each other. At the location of this detection system, an interference pattern is thus produced which shifts upon the occurrence of alignment errors of the mask with respect to the substrate.

To prevent alignment errors when using a CMP-processed substrate, or errors caused by mask imperfections, and to enhance the alignment accuracy, the alignment radiation diffracted in the fourth order by the substrate alignment mark is used, according to the invention, for the detection. The principle of the novel alignment method is shown diagrammatically in FIG. 4. The beam b from the alignment radiation source reaches the substrate grating mark $P_2$ via a reflector 27. This grating splits the incident beam into a plurality of sub-beams of different diffraction orders, the fourth-order sub-beams of which are passed by a fourth-order diaphragm 55' to the mask alignment mark $M_2$. Of the fourth-order sub-beams, only two, b(+4) and b(−4), are shown in the form of their chief rays denoted by broken lines. The radiation incident on the grating mark $M_2$ is again split into a number of diffraction orders. Apart from the magnification of the projection lens system PL, the grating M has a period which is half that of the grating $P_2$. The portion of the sub-beam b(+4), hence the sub-beam with the double diffraction order b(+4,+2), diffracted in the +2 order by the grating $M_2$, and the portion of the sub-beam b(−4), hence the sub-beam with the double diffraction order b(−4,−2) diffracted in the −2 order by this grating coincide and their chief ray is perpendicular to the mark $M_2$. A detector 13 is arranged in the path of the double sub-beam whose chief ray is shown by way of broken lines again.

An order diaphragm 56', i.e. a zero-order diaphragm is preferably arranged between the mask mark $M_2$ and the detector 13 so that it is ensured that only the sub-beams b(+4,+2) and b(−4,−2) reach the detector. By using only the fourth-order sub-beams coming from the substrate in the device, it is simulated that use is made of a grating mark whose effective grating period is ⅛ of the physical period. Consequently, the resolving power of the grating measuring system, or in other words, the accuracy with which alignment errors can be detected, is raised by a factor of four as compared with an alignment system in which the beam portions diffracted in the first order by the substrate alignment mark are used. Due to the lower effective grating period, the influence on the alignment signal of the above-mentioned errors which are proportional to the grating period is reduced considerably.

Figure 4:
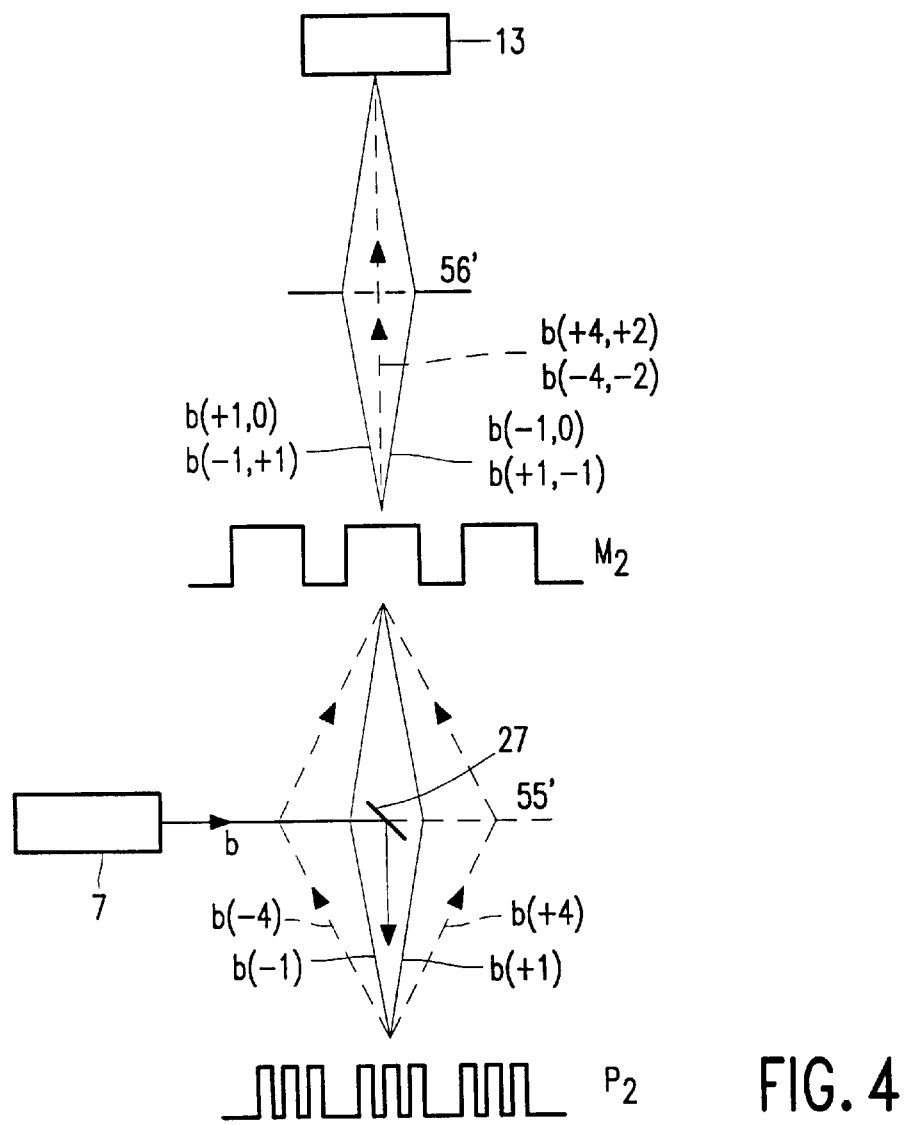
FIG. 4 shows a first selection, according to the invention, of alignment beam portions.
Figure 5:
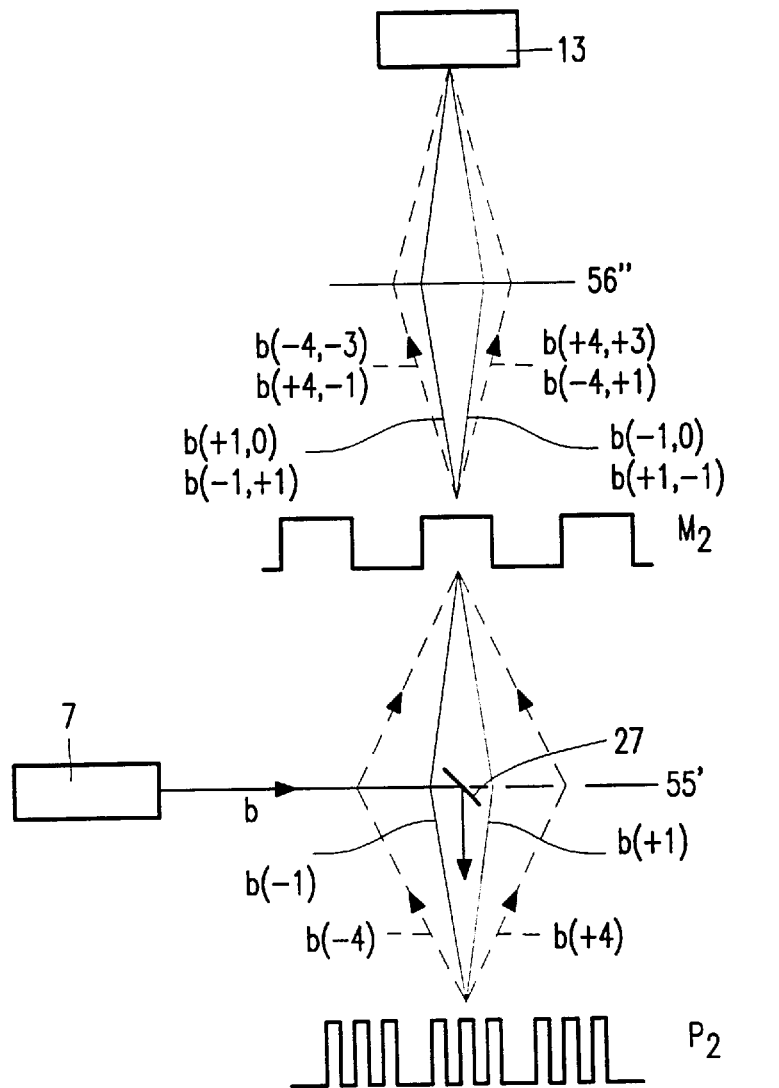
FIG. 5 shows a similar, second selection.

FIG. 5 shows a second embodiment of the device according to the invention. Here again, a fourth-order diaphragm is arranged in the projection lens system. The order diaphragm 56" in the detection branch is now, however, implemented in such a way that the portions of the sub-beams b(+4) and b(−4) diffracted in the +1 order and −1 order and in the +3 order and −3 order by the mask alignment mark $M_2$ are passed. The double order sub-beams which are now passed are the coinciding pair b(+4,+3) and b(−4,+1), and the coinciding pair b(−4,−3) and b(+4,−1). In the embodiment shown in FIG. 5, a larger portion of the alignment radiation diffracted in the fourth order by the substrate alignment mark is used than in the embodiment shown in FIG. 4. The order diaphragm 56' and the subsequent radiation in FIG. 4 path are, however, slightly simpler than in FIG. 5.

Instead of the sub-beams diffracted in the fourth order, also the sub-beams b(+2), b(−2) diffracted in the second order by the substrate alignment mark can be selected, in which case the fourth-order diaphragm 55' should be replaced by a second-order diaphragm. The portions of the sub-beams diffracted in the first order by the mask alignment mark $M_2$, hence the double order sub-beams b(+2,+1) and b(−2,−1) then coincide again and can be selected with a zero-order diaphragm instead of with the diaphragm 56". It is alternatively possible to select the portions of the sub-beams b(+2) and b(−2) diffracted in the second order by the mask alignment mark, hence the double order sub-beams b(+2,+2) and b(−2,−2). When the sub-beams diffracted in the second order by the substrate alignment mark are used, the resolving power of the alignment device is smaller than when using the fourth-order sub-beams. The quantity of radiation energy in the second-order sub-beams may, however, be larger than that in the fourth-order sub-beams.

As already indicated in FIGS. 4 and 5, the advantages of the known alignment system can be maintained in the alignment device according to the invention by building in the possibility of generating an alignment signal by means of the sub-beams diffracted in the first orders by the substrate alignment mark. The system which operates with the first-order sub-beams has a larger capture range, for example 40 µm for the grating marks with a period of 16 µm described with reference to FIG. 2. The order diaphragm 55' in FIGS. 4 and 5 should then be provided with extra apertures or radiation-transmissive areas passing the first-order sub-beams b(+1) and b(−1). Also the additional order diaphragm, 56' in FIG. 4 and 56" in FIG. 5, should then be provided with extra apertures which pass, for example, the coinciding double order sub-beams b(−1,0) and b(+1,−1) and the coinciding double order sub-beams b(+1, 0) and b(−1,+1) coming from the mask alignment mark $M_2$.

Figure 6:
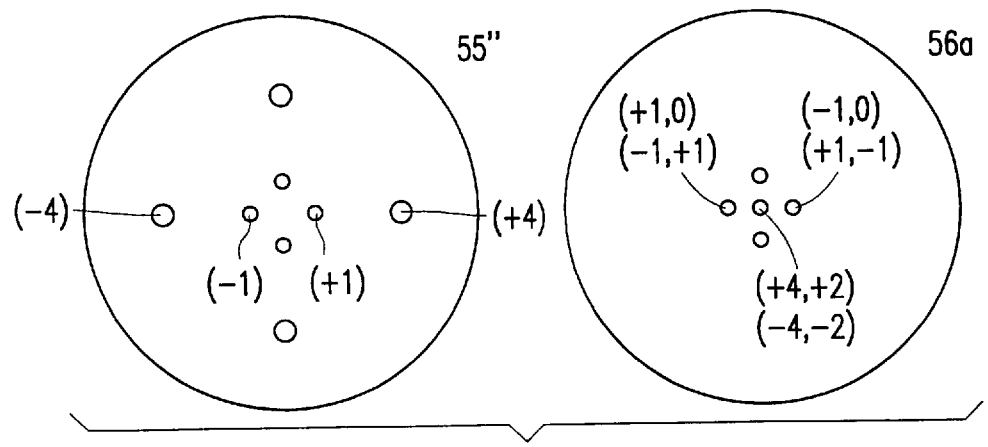
FIG. 6 is a plan view of a first embodiment of the order diaphragms with which such a selection is realized.

The left-hand part of FIG. 6 is a plan view of an order diaphragm 55" to be built into the projection lens system for selection of both the fourth-order and the first-order sub-beams of the substrate alignment mark, and the right-hand part shows a first embodiment of the associated additional diaphragm 56a. The diaphragm 56a corresponds to the diaphragm 56' of FIG. 4 but is provided with extra apertures for the sub-beams diffracted in the first orders by the substrate mark and in the zero order and the first orders by the mask mark. In FIG. 6, the apertures are shown by way of circles, while the passed single orders for the diaphragm 55" and the double orders for the diaphragm 56a are shown for the X direction. An analogous notation may be used for the Y direction.

Figure 7:
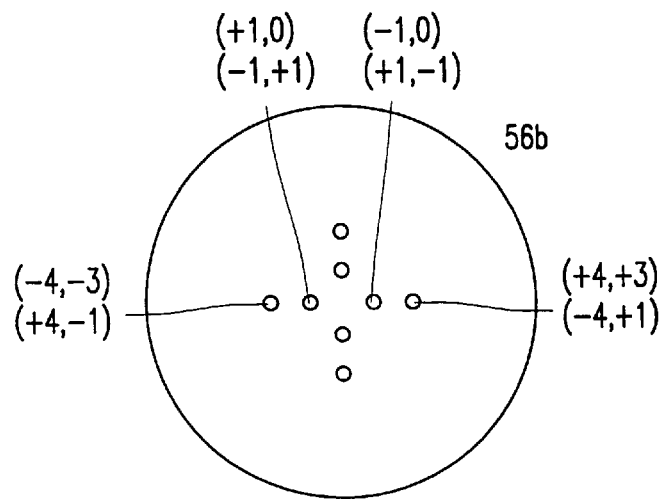
FIG. 7 shows a second embodiment of such an order diaphragm.

FIG. 7 shows an additional diaphragm 56b for use in the embodiment of FIG. 5 in which also the beam portions diffracted in the first orders by the substrate alignment mark are used. The associated diaphragm to be built into the projection lens system is identical to the diaphragm 55" in FIG. 6.

For the sake of completeness, it is to be noted that, for example (+4,+2) denotes the aperture passing a sub-beam diffracted in the +4 order by the substrate alignment mark and subsequently in the +2 order by the mask alignment mark.

In the projection apparatus provided with the alignment device according to the invention, correction elements are preferably arranged in the paths of the selected alignment beam portions. The reason for this and the functioning of these elements can best be elucidated with reference to the correction lens shown in FIG. 3, which lens is already present in the path of the first-order sub-beams in the known device.

Since the projection lens system PL is designed for the wavelength of the projection beam PB which, in connection with the desired large resolving power should be as small as possible, deviations may occur when this system PL is used for imaging the alignment marks $P_1$, $P_2$ and $M_1$, $M_2$ on each other by means of the alignment beam. For example, the substrate alignment marks $P_1$, $P_2$ will not be imaged in the plane of the mask pattern in which the mask alignment marks are located, but will be imaged at a given distance therefrom, this distance depending on the difference between the wavelengths of the projection beam and the alignment beam and on the difference between the refractive indices of the material of the projection lens elements for the two wavelengths. If the projection beam has a wavelength of, for example 248 nm and the alignment beam has a wavelength of 633 nm, this distance may be up to 2 m. Moreover, due to said wavelength difference, a substrate alignment mark is projected on a mask alignment mark with a magnification which deviates from the desired magnification while the deviation increases with an increasing wavelength difference.

To correct for said deviations, the projection lens system PL accommodates the correction lens 25 or another refracting or diffracting element. The correction lens is arranged at such a height in the projection column that, on the one hand, all first-order sub-beams coming from the substrate alignment mark can be influenced with this lens and, on the other hand, this lens has a negligible influence on the projection beam and the mask pattern image formed thereby.

Figure 8:
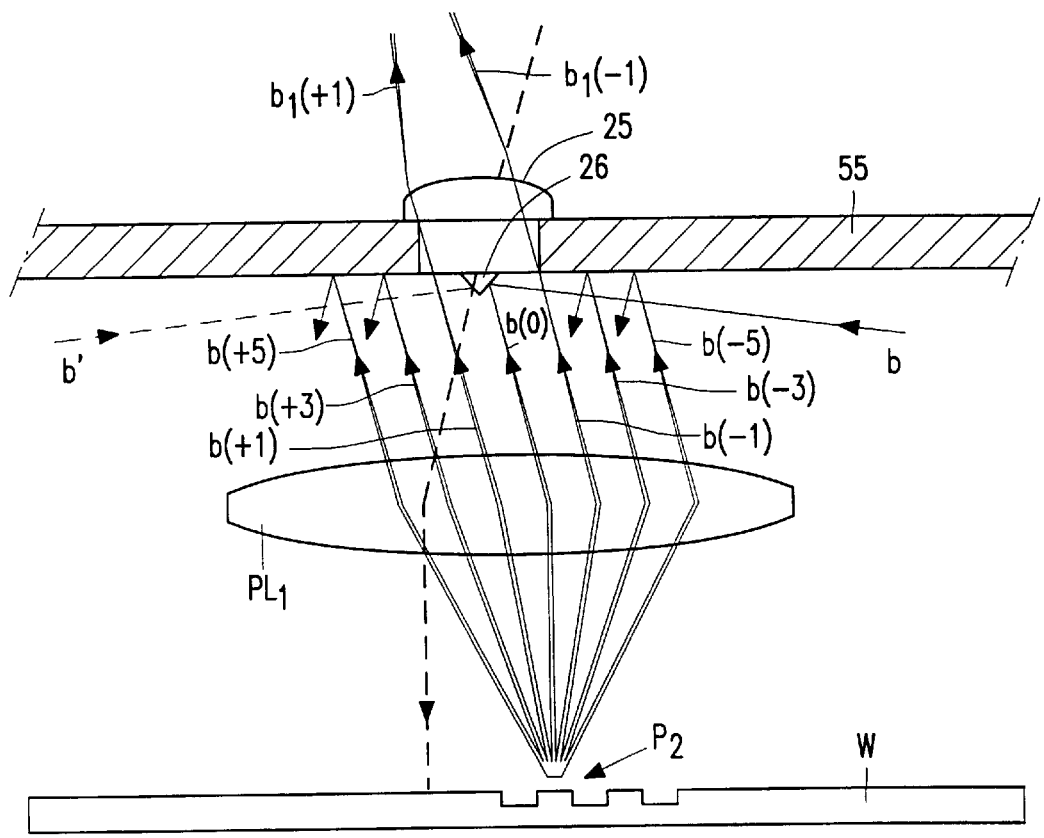
FIG. 8 shows the operation of a correction lens which may be used in the device.

The effect of the correction lens can be elucidated with reference to FIG. 8 which shows the part of the radiation path of the alignment beam portions between the correction lens and the substrate alignment mark $P_2$. The alignment beam b incident on the diffraction grating $P_2$ is split into a zero-order sub-beam b(0) which, upon perpendicular incidence of the beam b, has the same direction as the beam b, two sub-beams, b(+1) and b(−1) of the first order and a number of pairs of sub-beams of the third, the fifth, etc. orders. These sub-beams are reflected towards the projection lens system. The first-order sub-beams reach the correction lens 25 located in the plane 24. This lens has such a power that it changes the directions of the first-order sub-beams b(−1) and b(+1) in such a way that the chief rays of these beams intersect each other in the plane of the mask alignment mark $M_2$. The correction lens has such a small diameter that the higher order sub-beams, which are deflected by the mark P through larger angles than the first-order sub-beams, do not pass through this lens. An element preventing the zero-order sub-beam b(0) from passing through the correction lens is arranged proximate to the correction lens. In the embodiment of FIG. 8, this element is constituted by the reflecting prism 26 which is used for coupling the alignment beams b and b' into the projection lens system. This prism reflects the zero-order sub-beam in the direction of the incident alignment beam b. Due to said measures, it is achieved that only the first-order sub-beams are used for imaging the alignment grating $P_2$ on the alignment grating $M_2$, so that some additional advantages can be achieved.

The zero-order sub-beam does not comprise information about the position of the alignment grating $P_2$. Dependent on the geometry of the grating, notably the depth of the grating grooves and the ratio between the width of these grooves and the width of the grating intermediate strips, this beam may have a considerable intensity as compared with the intensity of the first-order sub-beams. By suppressing the zero-order sub-beam, the contrast in the image of $P_2$ may be enhanced considerably. When using the first-order sub-beams only, the second harmonic of the grating $P_2$ is, as it were, imaged, in other words, apart from the magnification M of the projection lens system PL, the image of $P_2$ has a period which is half that of the grating $P_2$. If it is ensured that the grating period of the grating $M_2$ is equal to that of the image of $P_2$, i.e. equal to M/2 times the grating period of the grating $P_2$, the accuracy with which the gratings M and P are aligned is twice as large as in the case where the full beam b is used for the projection.

Under circumstances, particularly at a smaller difference between the wavelengths of the projection beam PB and an alignment beam b, b', and when using achromatic lens elements in the projection lens system, it may occur that sub-beams having diffraction orders of more than one still reach the mask alignment mark $M_2$ via the projection lens system. To prevent this, the first-order diaphragm plate 55 is arranged in the plane of, or proximate to, the correction lens 25. The material of the plate may be dichroic and transparent to the projection beam, but opaque to the alignment radiation. Then, areas which block the alignment radiation are present at those positions where parts of the alignment beam with diffraction orders higher than one reach the plate. These areas are small and jointly cover only 5 to 10% of the pupil surface area of the projection lens system, so that they have a negligible influence on the projection beam.

The correction lens 25 does not only ensure that an alignment sub-beam is sharply focused on the mask plane, but may also correct for an error in the magnification with which a substrate alignment mark is imaged on a mask alignment mark, which magnification error results from the fact that the projection lens system is designed for the wavelength of the projection beam instead of for that of the alignment beam. This magnification error correction will be sufficient in many cases. In an apparatus in which a deep ultraviolet beam having a wavelength of, for example 248 nm is used as a projection beam, it may occur that the correction lens 25 cannot completely correct the magnification error. In that case, an extra lens, 9 in FIG. 3, may be arranged in the path of the alignment beam between the projection lens system PL and the mask alignment mark so as to eliminate the residual magnification error.

In the alignment device according to the invention, in which sub-beams diffracted by the substrate alignment mark in one of the even orders are used, these sub-beams can no longer be corrected with one correction element because, due to the deflection angle increasing with an increasing diffraction order number, the different sub-beams of the selected order are so far apart that a lens receiving all these beams covers too large a part of the projection beam. For this reason, a number of correction elements equal to the number of sub-beams of the selected order are used in the device according to the invention, i.e. four correction elements in the case of two-dimensional alignment marks. These correction elements may be arranged proximate to the radiation-transmissive areas of the order diaphragm, or in the apertures of this diaphragm.

Figure 9:
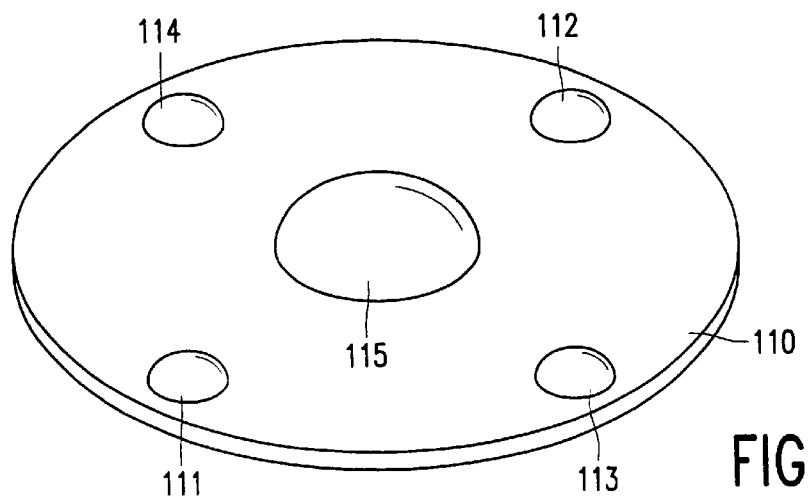
FIG. 9 shows an order diaphragm provided with correction elements.

FIG. 9 shows an embodiment of a diaphragm plate 110 with such correction elements for use in an alignment device in which the fourth-order sub-beams are selected. These correction elements, in the form of small lenses 111–114, for the sub-beams $b(+4)_x$, $b(4)_x$, $b(+4)_y$ and $b(-4)_y$ for the beam portions diffracted in the plus and minus fourth order in the X and Y directions cover the apertures in the diaphragm plate 110. As is also shown in FIG. 9, the plate 10 may also comprise a central lens 115 which is larger than the lenses 111–114, which lens has the same function as the lens 25 in FIG. 3 if also the first-order diffracted sub-beams are used. Just like the correction lens 25, the correction lenses 111–115 may be replaced by other refractive elements, such as double wedges, or by diffractive elements.

Figure 10:
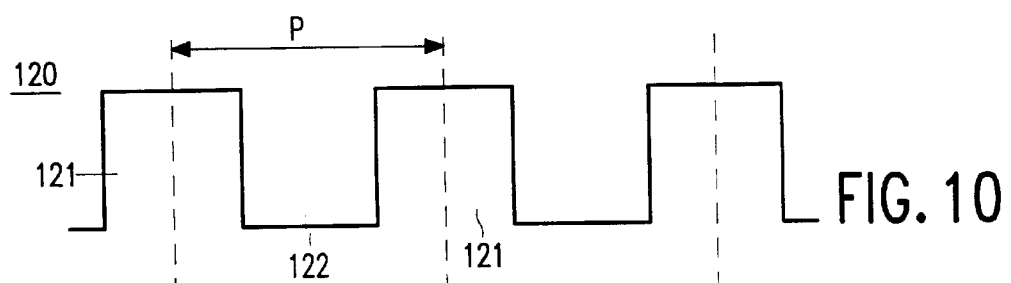
FIGS. 10, 11, 12 and 13 show parts of different embodiments of an associated first grating mark.
Figure 11:
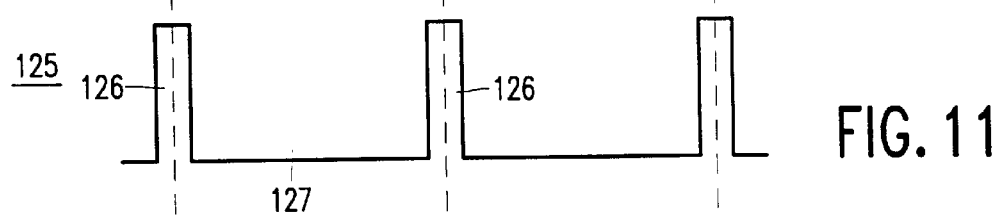
Figure 12:
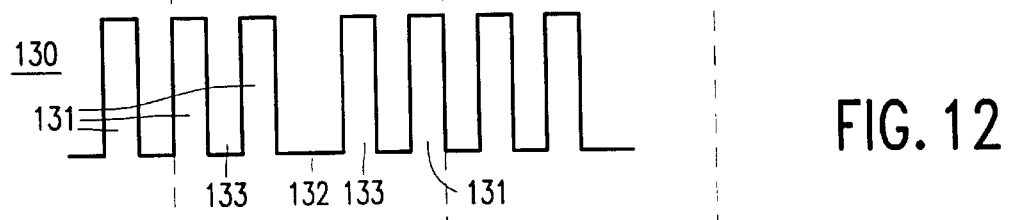
Figure 13:
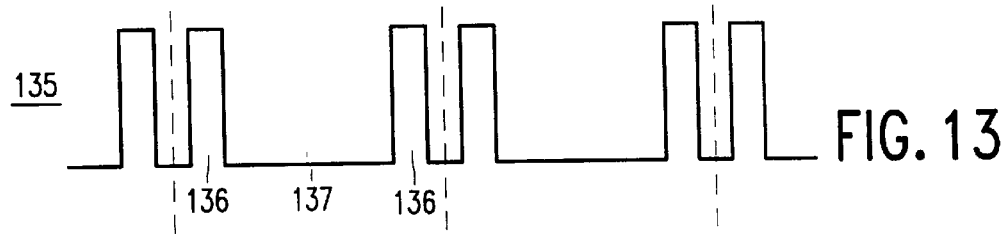

The substrate alignment mark shown in FIG. 2 is not optimized for generating fourth-order sub-beams. A further aspect of the present invention therefore relates to the optimization of the grating geometry. FIGS. 11, 12 and 13 show small parts of different suitable grating geometries, while for comparison, FIG. 10 shows a part of the grating structure according to FIG. 2. In the latter structure, 120, the grating grooves 121 are as wide as the intermediate strips 122, thus both are 8 μm if the structure has a period p=16 μm.

FIG. 11 shows a special grating structure 125 for generating fourth-order sub-beams. The grating grooves 126 have a width which is equal to ¼ of that of the grooves 121 of FIG. 10, i.e. 2 μm in the example and thus only ⅛ of the grating period p.

To intensify the alignment signal generated by means of the fourth-order sub-beams, the grating structure 130 of FIG. 12 is preferably used. Here, four grating grooves 131 are present per grating period, each being 2 μm wide in the relevant example. An intermediate strip 132 having a width which is twice that of the grating grooves is present between the second and the third groove in each period, while the width of the intermediate strips 133 between the first and the second grating groove and that between the third and the fourth grating groove is equal to the width of the grating groove.

If a given amount of radiation in the first orders is desirable in addition to a given amount of radiation in the fourth orders, it is possible to choose the grating structure 135 of FIG. 13 in which two grating grooves 136 are present per grating period and the width of the intermediate strip 137 is equal to five times the width of these grooves.

All the substrate marks shown in FIGS. 11, 12 and 13 are projected on a mask alignment mark which, apart from the magnification of the projection lens system, has a period which is equal to half that of the mark according to FIG. 10, but a geometry which is equal to that of this mark.

It is to be noted that the values for the grating period and groove width given above are only examples. This period and width may alternatively be larger or smaller, with said ratio between groove width and period and the number of grooves per period being maintained.

Figure 14:
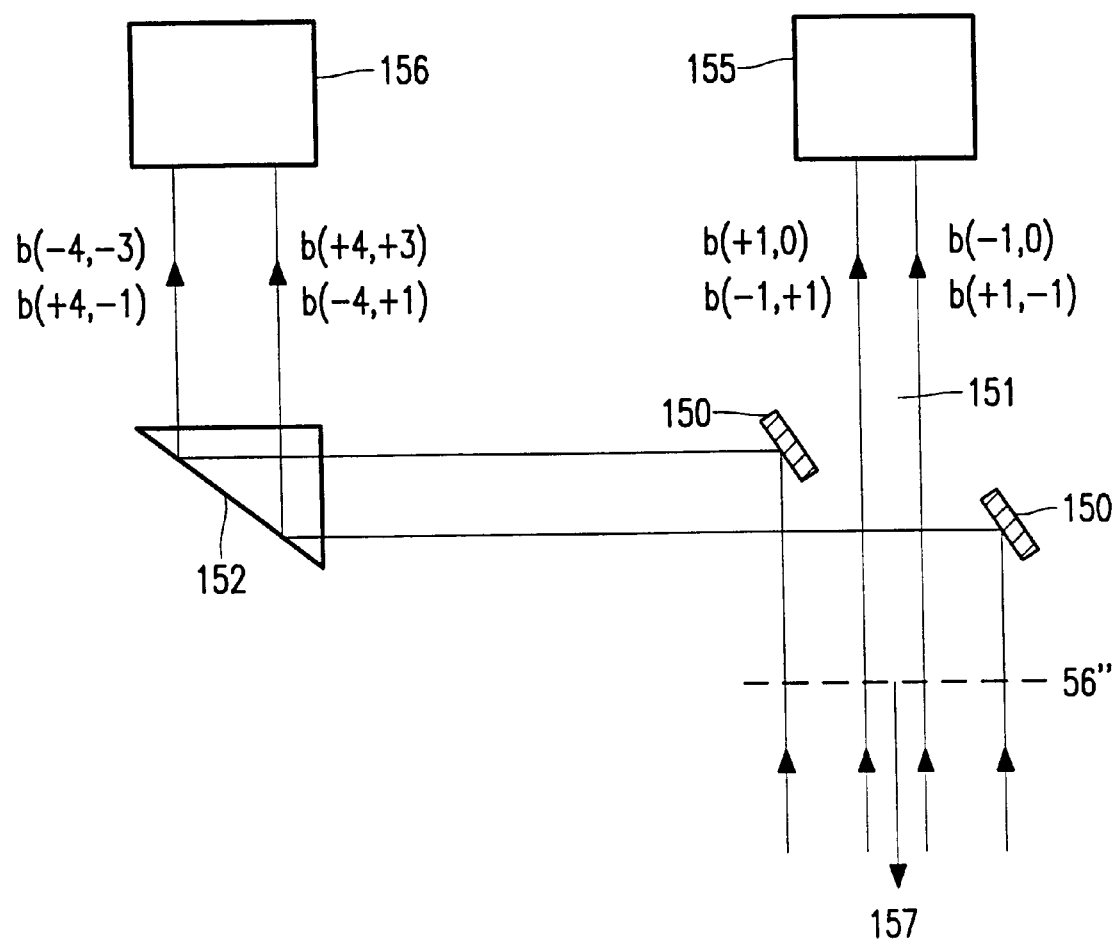
FIG. 14 shows an embodiment of a beam separator arranged behind the second alignment mark for separating the fourth-order sub-beams from the first-order sub-beams.

FIG. 14 shows how the sub-beams diffracted in the fourth order by the substrate alignment mark can be separated in the detection branch from the sub-beams diffracted in the first order by said mark. To this end, for example, the combined path of these sub-beams incorporates a reflector 150 which is provided with a central aperture 151. The first-order sub-beams $b(+1,0)$, $b(-1,+1)$ and $b(-1,0)$, $b(+1,-1)$ are passed through this aperture to their own detector 155. The fourth order sub-beams $b(-4,-3)$, $b(+4,-1)$ and $b(+4,+3)$, $b(-4,+1)$ are reflected by the reflector 150 and reach their detector 156 via a reflecting prism 152. The arrow 157 symbolically shows the orders blocked by the order diaphragm 56".

Figure 15:
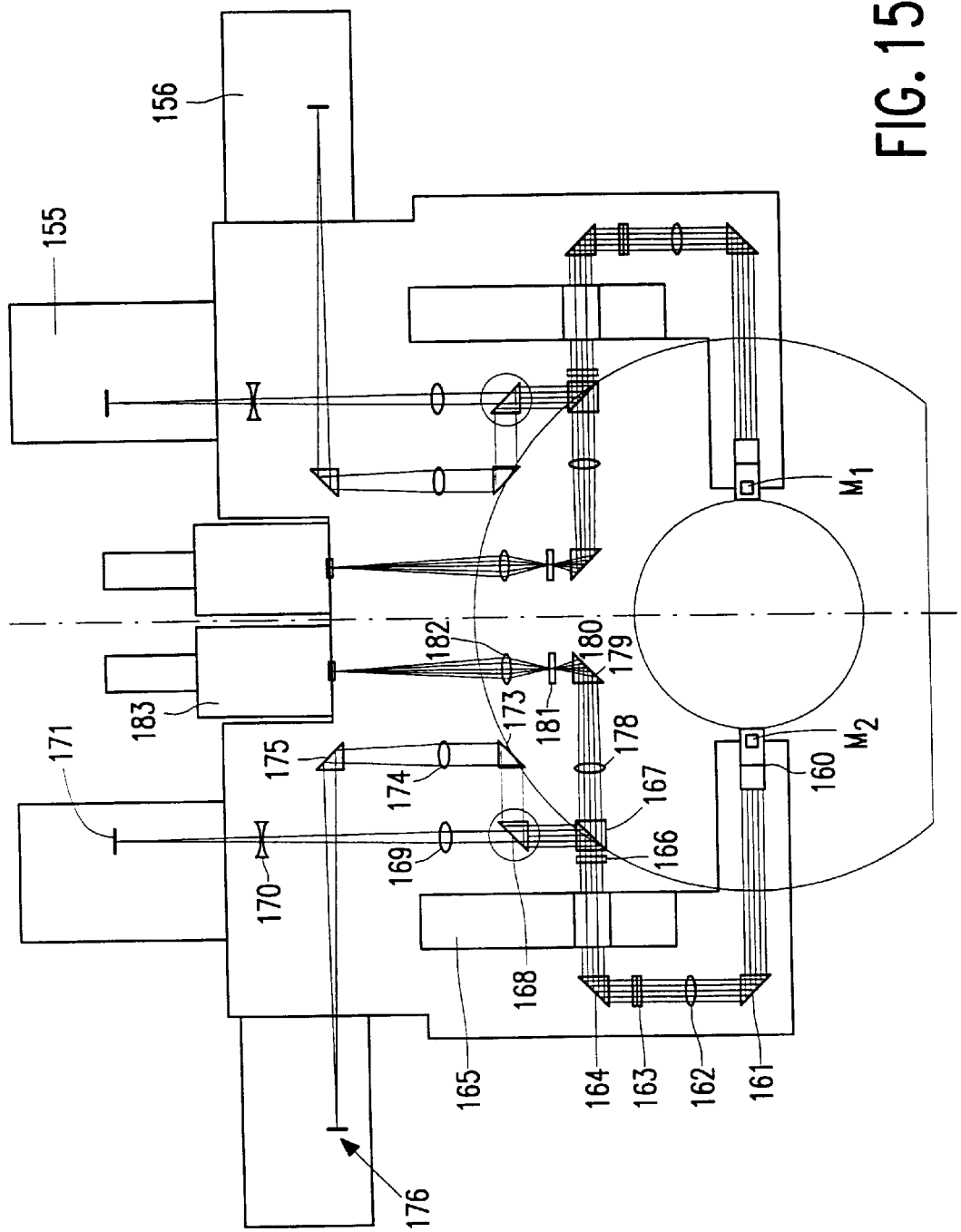
FIG. 15 shows a detailed embodiment of the radiation path between the second alignment mark and the detection system.

FIG. 15 shows a more detailed embodiment of the detection branch of a projection apparatus provided with a double alignment device. The references $M_1$ and $M_2$ denote the mask alignment marks. The left and right alignment devices have an identical structure, so that it is sufficient to describe the left-hand part of FIG. 15 only. The radiation coming from the mask mark $M_2$ is coupled into the detection branch by a prism system 160 and is then reflected successively by the prisms 161 and 164 to a beam splitter 167. A lens 162 and a correction plate 163 are arranged between the prisms 161 and 164. An optical modulator 165 and a polarization analyzer 166 are arranged in front of the beam splitter. The radiation reflected by the beam splitter 167 is incident on a reflector 168 having a central aperture analogous to that of the reflector 150 in FIG. 14. The reflector 168 transmits the first-order sub-beams to a detector 171, which beams pass the lenses 169 and 170. The fourth-order sub-beams are reflected by the reflector 168 and reach the detector 176 via further reflections on the prisms 173 and 175. A further lens 174 is arranged between the prisms 173 and 175. The radiation passed by the beam splitter 167 may be guided to a camera 183 via a prism 180 and a lens 182, so that the alignment is also rendered visible to the operator of the apparatus.

As is shown in FIGS. 1 and 3, the chief rays of the beams $b_1$ and $b_1'$, which chief rays can be considered to be the axes of symmetry of the sub-beams formed by the substrate alignment marks $P_2$ and $P_1$, traverse the mask plate MA obliquely. A part of this mask plate at the location of the alignment mark $M_1$ in the form of a grating is shown on a larger scale in FIG. 16. This Figure also shows the chief rays $b_1'(+1)$ and $b_1'(-1)$ which are formed by the substrate alignment mark (not shown). The reference SA denotes the axis of symmetry of the sub-beams $b_1'(+1)$ and $b_1'(-1)$, and the direction of this axis coincides, for example, with that of the zero-order sub-beam $b_1'(0)$ which is blocked and does not reach the mark $M_1$. The sub-beams $b_1'(+1,0)$ and $b_1'(+1,-1)$ formed by the grating mark $M_1$ from the sub-beam $b_1'(+1)$ and the sub-beams $b_1'(-1,0)$ and $b_1'(-1,+1)$ formed from the sub-beam $b_1'(1)$ are captured by the detection system (not shown). The sub-beams having other double diffraction orders may be either blocked or diffracted at such angles that they do not reach the detection system.

Figure 16:
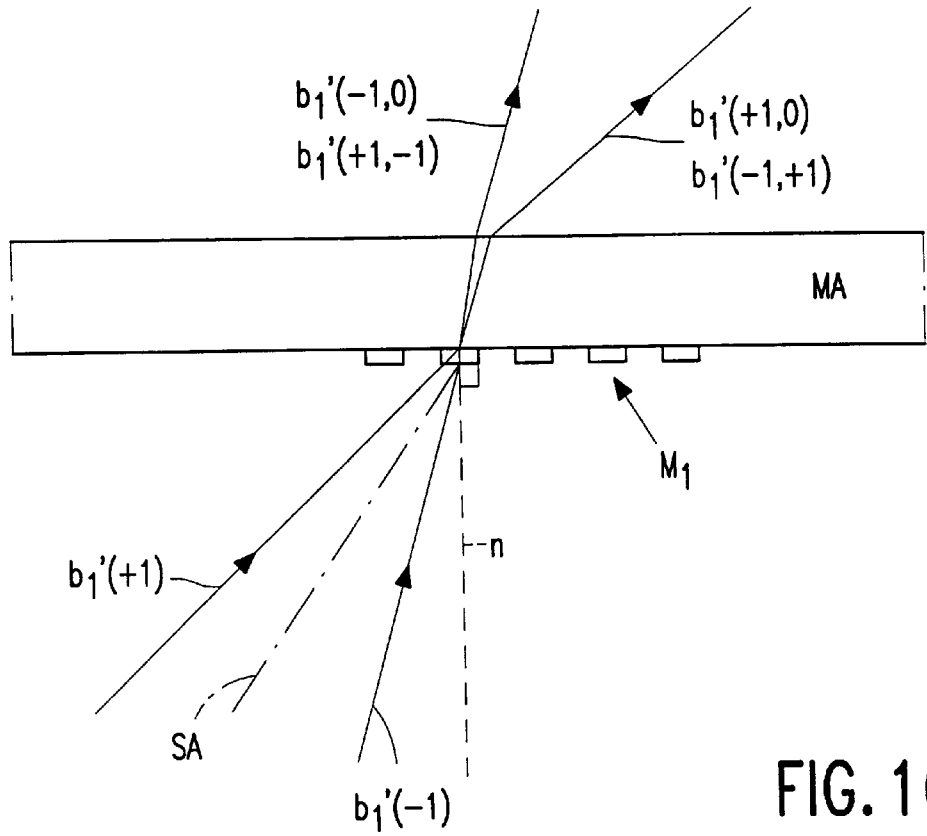
FIG. 16 shows the path of the alignment radiation through the mask plate.
Figure 17:
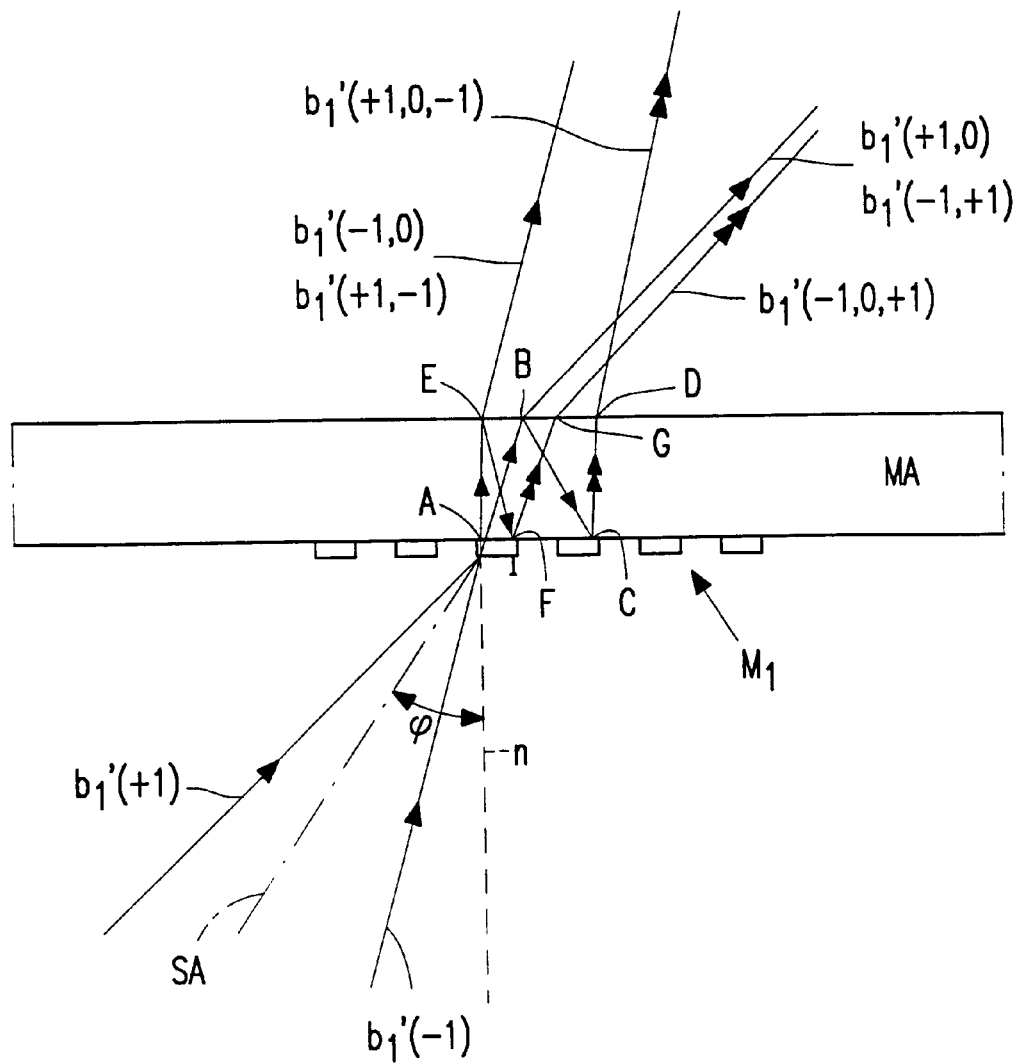
FIG. 17 shows this path when reflections occur on this plate.

As long as only the sub-beams $b'(-1,0)$, $b_1'(+1,-1)$, $b_1'(+1,0)$ and $b_1'(-1,+1)$ shown in FIG. 16 interfere with each other at the location of the detection system, the oblique position of the symmetry axis does not result in an alignment error. However, as the Applicant has discovered and as is shown in FIG. 17, a portion of the double order sub-beam $b_1'(+1,0)$ may be reflected by the upper side of the mask plate MA so that it is once more incident on the grating mark $M_1$. The three-fold order sub-beam $b_1'(+1,0,-1)$ is then formed by this grating, which sub-beam has the same direction as the double order sub-beams $b_1'(-1,0)$ and $b_1'(+1,-1)$. A portion of the double order sub-beam $b_1'(-1,0)$ may also be reflected by the upper side of the mask plate so that it is once more incident on the grating mark $M_1$. This produces a three-fold order sub-beam $b_1'(-1,0,+1)$ which has the same direction as the double order sub-beams $b_1'(+1,0)$ and $b_1'(-1,+1)$.

Although the mark $M_1$ may also supply 3rd-order, 5th-order and higher order beams and also higher order reflections may occur in the mask plate, it is sufficient and better for the purpose of comprehension to discuss the two-fold and three-fold first-order diffracted sub-beams only.

The sub-beam $b_1'(+1,0,-1)$ has covered the path A,B,C,D in the mask plate MA and the sub-beam $b_1'(-1,0,+1)$ has covered the path A,E,F,G which is shorter than the path A,B,C,D. Consequently, there is a phase difference among the three-fold order sub-beams $b_1'(+1,0,-1)$ and $b_1'(-1,0,+1)$ and between these sub-beams and the corresponding double order sub-beams. As a result of this phase difference, which is mainly dependent on the thickness of the mask plate and the angle $\phi$ between the axis of symmetry SA and the normal n on the mask plate, the interference pattern is displaced with respect to the detection system, which displacement is independent of alignment errors. As a result of this displacement, an offset occurs in the alignment signal and in the realized alignment of the mask with respect to the substrate, and the magnitude of this offset is dependent on the reflection coefficient and the thickness of the mask plate. For one projection apparatus, in which different masks are used, this offset may be different for the different masks, while for one mask, which is consecutively used in different projection apparatuses, the offset in the different apparatuses may be different because the angle $\phi$ may be different.

Said offset is relatively large when using coherent alignment radiation as is supplied by a gas laser, but may also occur, though to a lesser extent, when using less coherent or non-coherent alignment radiation as supplied by excimer lasers, semiconductor lasers or mercury lamps.

To eliminate said alignment error, a beam deflection element may be arranged between the projection lens system PL and the mask plate MA, which element ensures that the axis of symmetry of the sub-beams used is perpendicular to the mask plate, or in other words, the chief rays of these equal but opposite diffraction orders sub-beams are incident on the mask plate at equal but opposite angles.

Figure 18:
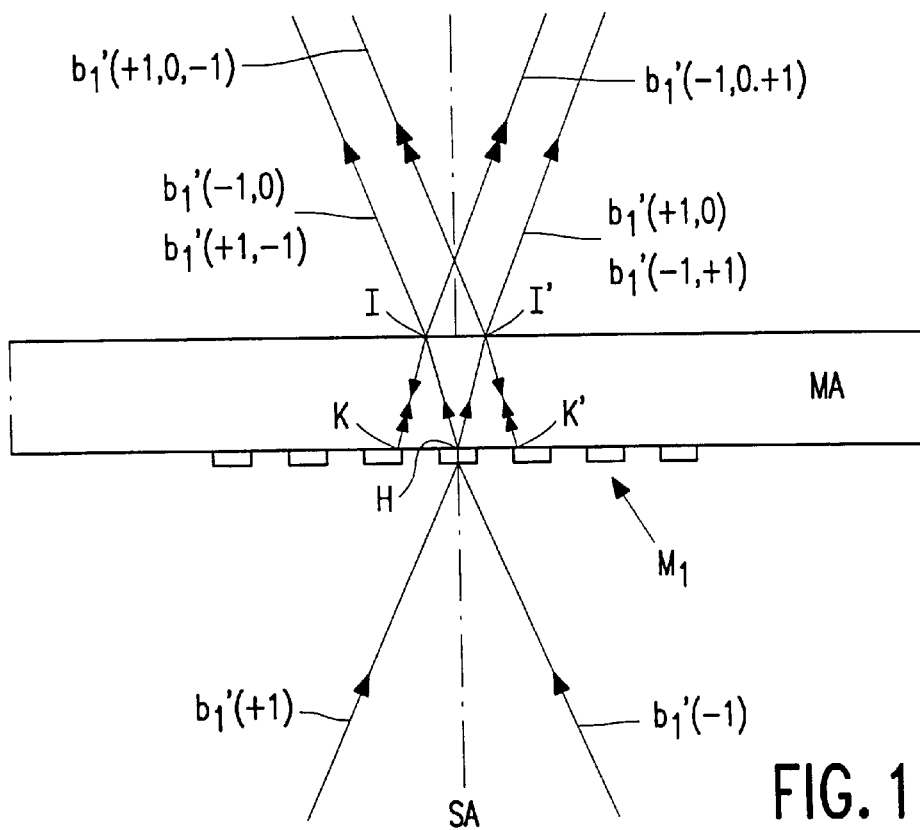
FIG. 18 shows the path of the alignment radiation through the mask plate in a device according to the invention with a radiation deflection element.

FIG. 18 shows the situation in which the first-order sub-beams $b_1'(-1)$ and $b_1'(+1)$, which originate from the substrate alignment mark $P_1$, are symmetrically incident on the mask alignment mark $M_1$. The portion of the sub-beams $b_1'(-1,0)$ which is reflected by the upper side of the mask plate and is reflected as a three-fold order sub-beam $b_1'(-1,0,+1)$ by the grating $M_1$ traverses the path HIK through the mask plate, which path is equally long as the path HI'K' traversed by the three-fold order sub-beam $b_1'(+1,0,-1)$, which sub-beam is formed from the part of the sub-beam $b_1'(+1,0)$ reflected by the upper side of the mask plate. Then there is no longer any phase difference between the three-fold order sub-beams and the corresponding two-fold order sub-beams, whereby the cause of the alignment error described hereinbefore is eliminated.

Figure 19:
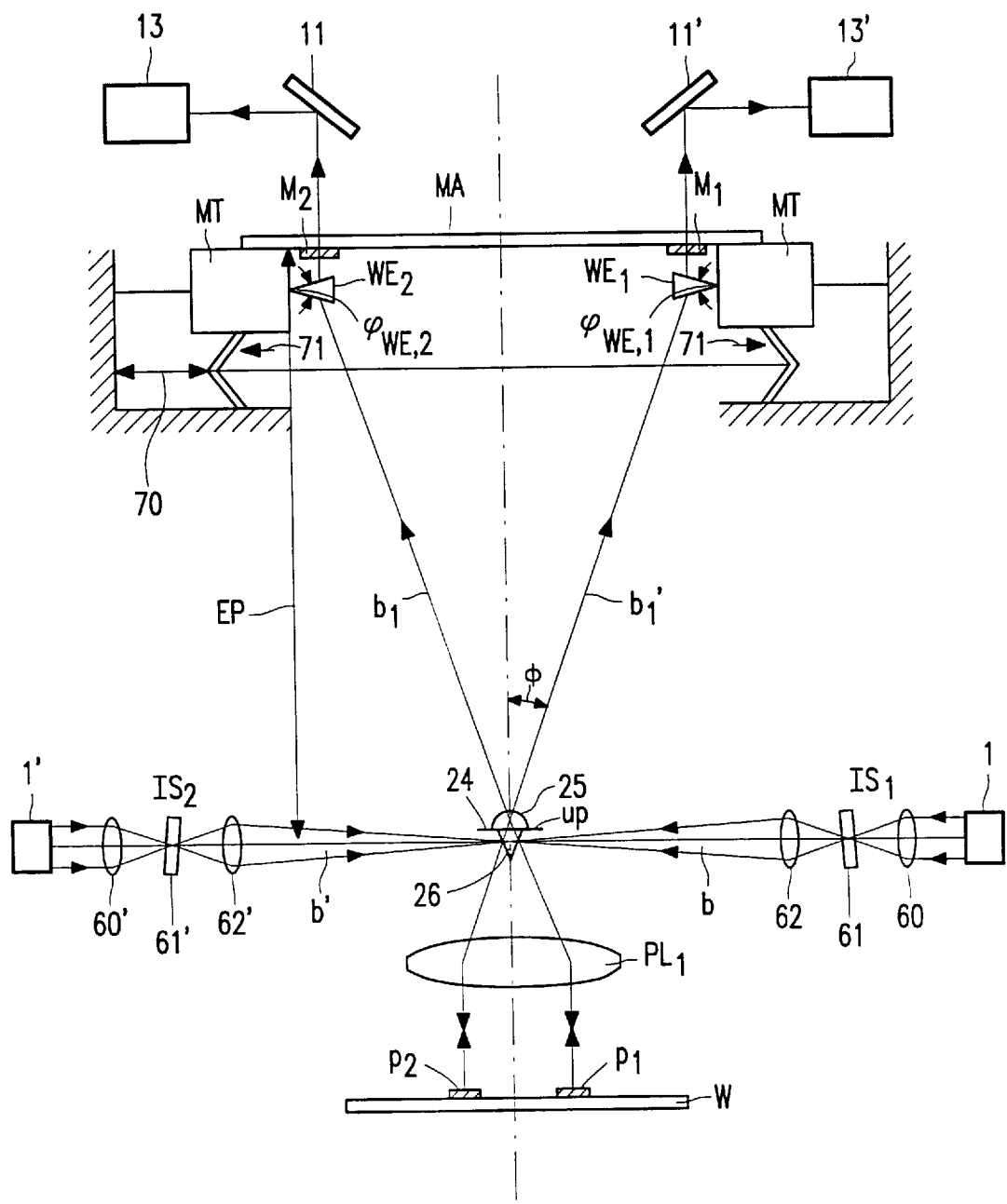
FIG. 19 shows an embodiment of such a device.

FIG. 19 shows an embodiment of a double alignment device in which the extra deflection elements are used. Wedge-shaped elements $WE_1$ and $WE_2$ are arranged under the mask alignment marks $M_1$ and $M_2$, which elements deflect the chief rays of the alignment beams $b_1'$ and $b_1$ from the substrate alignment marks $P_1$ and $P_2$ in such a way that these chief rays are perpendicular to the mask plate MA. The alignment beams traverse the marks $M_1$ and $M_2$ in known manner and are subsequently directed towards the detection systems 13' and 13 by the reflectors 11' and 11. The mask and the substrate can be aligned with respect to each other by means of the output signals of these systems, for example, by displacing the mask table MT, as is symbolically indicated by means of the double-headed arrow 70 and the parallelogram construction 71 described in U.S. Pat. No. 4,698,575.

In the embodiment of FIG. 19 the alignment beams b and b' coming from two separate illumination systems $IS_1$ and $IS_2$ each comprising a radiation source 1 (1'), two lenses 60, 62 (60', 62') and an adjustable plane-parallel plate 61 (61') with which a precision adjustment of the direction of the beam b (b') can be realized. The lenses 60 and 62 ensure that the quality of the image of the source 1 (1') is maintained. The beams b and b' are reflected towards the substrate alignment marks $P_1$ and $P_2$ by a reflecting prism 26 which is present within the projection lens system. For the sake of simplicity, only the lens group under the Fourier plane is diagrammatically illustrated by means of one lens element $PL_1$ in this projection lens system.

The beam-coupling prism 26 is preferably present at the height of the Fourier plane of the projection lens system. The angle $\Phi$ which must be corrected by the wedge is defined by:

$$\tan\phi = \frac{M_1 - M_2}{2EP}$$

in which $M_1-M_2$ is the distance between the mask marks $M_1$ and $M_2$ and EP is the distance between the mask plate MA and the exit pupil UP of the projection lens system at the side of the mask. In one embodiment of the projection apparatus, in which the distance between the marks $M_1$ and $M_2$ is 96 mm and the distance EP is 400 mm, the angle $\Phi$ to be corrected is 120 mrad. This requires a wedge having a wedge angle $\phi_{WE}$ of only 240 mrad. Such a wedge may consist of a small piece of glass having a thickness of only 2 mm. It is not necessary to impose strict requirements of mechanical and thermal stability on such a wedge.

In the axial direction the wedge must be positioned in a stable manner with respect to the mask plate with an accuracy of $$\frac{M \cdot \Delta a}{\varphi} \cdot \frac{\text{nm}}{\text{mrad}}.$$

Here M is the magnification of the projection lens system and $\Delta a$ is the still admissible alignment error at the area of the substrate. In one embodiment with M=5,$\Delta a$=5 nm and $\phi$=120 mrad the value of $$\frac{M \cdot \Delta a}{\varphi} = 120 \, \text{nm}.$$

It has been found that with such a wedge the measurement and control of the magnification error which, as described in U.S. Pat. No. 4,778,275 can be carried out with the aid of the substrate marks $P_1$ and $P_2$ and the mask marks $M_1$ and $M_2$, still functions satisfactorily, provided that the distance between the mask marks $M_1$ and $M_2$ is considerably shorter than the distance EP in FIG. 19.

Instead of a wedge, a different element such as, for example, a mirror or a lens may be used to correct the directions of the selected order sub-beams.

The invention may not only be used in an apparatus having a double alignment device and a refractive correction element 25, but also in a double alignment device without this element, such as the device described in U.S. Pat. No. 4,778,275. The invention may be further used in a single alignment device including a correction element 25 or without this element, such as the device described in U.S. Pat. No. 4,251,160.

Figure 20:
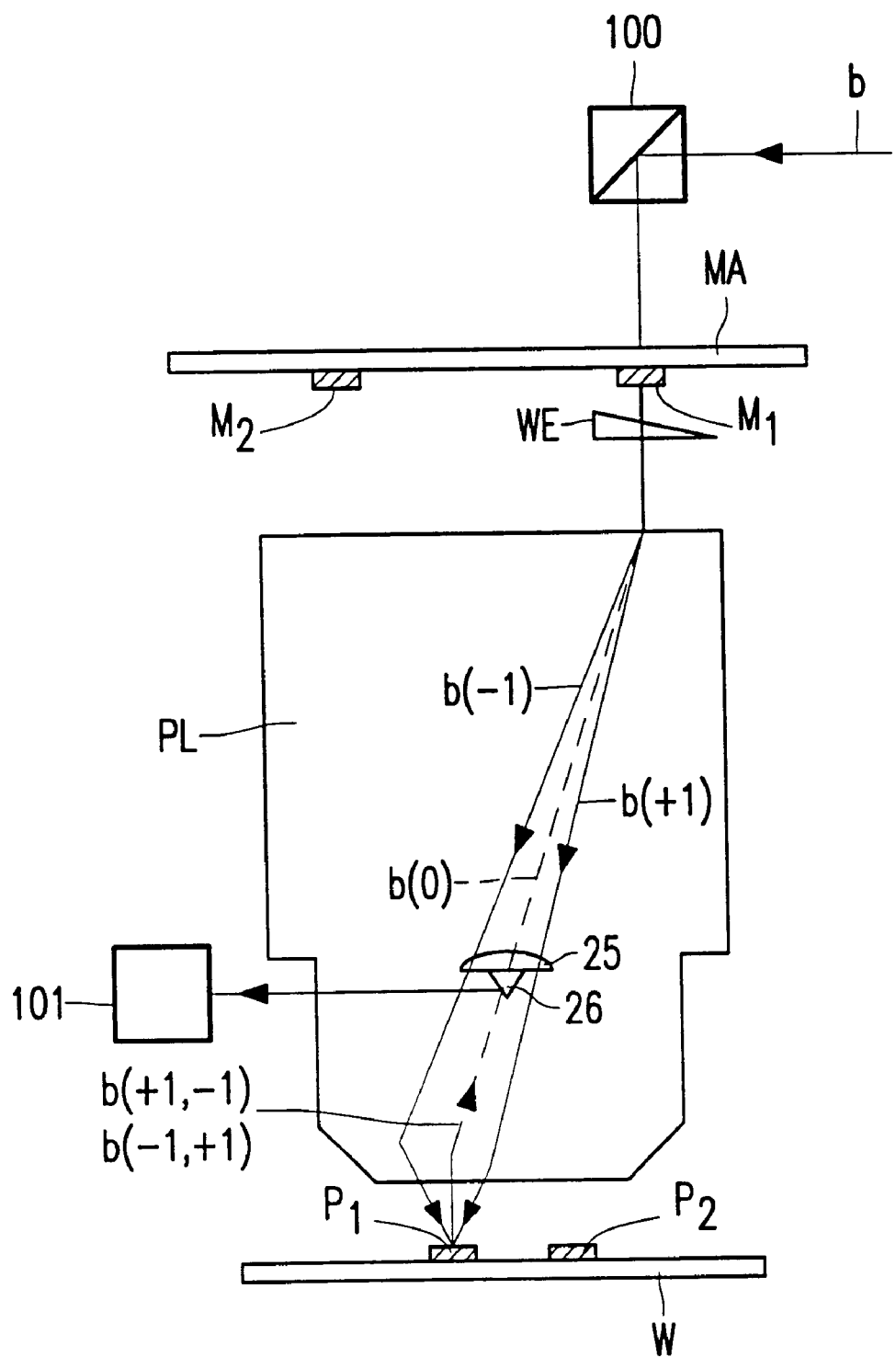
FIG. 20 shows a second embodiment of an alignment device according to the invention.

FIG. 20 shows an embodiment of the alignment device in which a mask alignment mark, $M_1$ or $M_2$, or a substrate alignment mark, $P_1$ or $P_2$, is imaged by the projection lens system and with the aid of diffracted order sub-beams which are formed by the mask alignment mark from the entering beam b. As in the other embodiments, these sub-beams traverse the projection lens obliquely. In order to cause the beam b to be incident perpendicularly to the mask plate MA via the prism 100 under this condition, so that extra reflections on this plate do not have any influence on the alignment signal obtained, a wedge-shaped or other deflection element WE is arranged below the mask plate. The portions of the sub-beams which are reflected by the substrate alignment mark $P_1$ and diffracted, i.e. the two-fold order sub-beams, comprising information about the mutual position of the marks $M_1$ and $P_1$, are reflected to the detection system 101 by the reflector 26.

The alignment device according to FIG. 20 and may alternatively be doubled.

Generally, a double alignment system is preferred because the relative angle orientation of the mask pattern and the substrate is directly laid down optically, while magnification errors of the projection lens system as well as deformations in the substrate and the mask can be measured.

The accuracy with which the substrate alignment marks can be aligned with respect to the mask alignment marks is considerably enhanced by modulating the output signals of the detectors, for example, 13 and 13' in FIGS. 1, 3 and 29, with a fixed frequency. To this end the mask M and hence, for example, the mask mark $M_2$ can be periodically moved, as has been described in the article in "SPIE", Vol. 470 "Optical Microlithography" III "Technology for the next Decade" 1984, pp. 62–69. A better alternative for obtaining a dynamic alignment signal, described in U.S. Pat. No. 4,251,160, with which the accuracy of the alignment device according to the invention can also be enhanced is shown in FIG. 3.

Before reaching the mark $M_2$, the beam $b_1$ has traversed the polarization-sensitive splitting prism 2 so that this beam is linearly polarized and has a given direction of polarization. Subsequently, the beam $b_1$ traverses a plate 8 of birefringent material, for example, quartz whose optical axis extends at an angle of 45° to the direction of polarization of the beam leaving the prism 2. The element 8 may also be a Savart plate or a Wollaston prism. Two mutually perpendicularly polarized beams leave the plate 8, which beams are shifted with respect to each other at the location of the mask mark $M_2$ along a given distance which is determined by the geometry of the mark $M_2$. When using gratings as alignment marks, said distance is equal to half the grating period of the grating $M_2$. A polarization modulator 18 and a polarization analyser 19 are arranged in front of the detector 13. The modulator 18, for example, an elasto-optical modulator is controlled by a voltage $V_B$ which is supplied by a generator 20. The direction of polarization of the beam passing through the modulator is thereby switched alternately through 90°. The analyser 19 has the same main direction, or pass direction, as the polarization-sensitive splitting prism 2 so that alternately a first radiation beam having a first direction of polarization, which beam has formed, for example, a non-shifted image of $P_2$ on $M_2$, and a second radiation beam having a second direction of polarization, which beam has formed, for example, an image of $P_2$ on $M_2$ shifted through half a grating period, are passed to the detector 13. The signal of the detector 13 is amplified and processed in a phase-sensitive detection circuit 21 to which also the signal $V_B$ is applied. The output signal $S_A$ is the desired dynamic alignment signal.

The modulator 18 and analyser 19 may alternatively be arranged in the radiation path in front of the mask alignment mark.

In the alignment device, in which, for example, both the fourth-order sub-beams and the first-order sub-beams are used, the thickness of the plate will have to be optimized so that it is usable for both orders, the sub-beams of which traverse said plate at different angles.

We claim:

1. An alignment device for aligning a first object, which is provided with at least a first alignment mark, with respect to a second object which is provided with at least a second alignment mark, said device comprising a radiation source for supplying at least an alignment beam, a first object holder for supporting the first object, a second object holder for supporting the second object, means for directing said alignment beam to said first alignment mark, a projection system for projecting said first alignment mark on said second alignment mark, and a radiation-sensitive detection system arranged in the path of alignment beam portions coming from the first alignment mark and from the second alignment mark on which the first alignment mark is projected, the output signal of said radiation-sensitive detection system being a measure of the mutual position of the first and second alignment marks, characterized in that at least portions of said alignment beam being of a wavelength such that said portions are diffracted by the first alignment mark in one of the even orders and transmitted by the first alignment mark, an order diaphragm is arranged in the path of the radiation between the first alignment mark and said second alignment mark, the order diaphragm having radiation-transmissive portions which transmit only those alignment beam portions to the second alignment mark which are diffracted by the first alignment mark in one of the even orders, the order diaphragm transmitting to said second alignment mark at least said alignment beam portions transmitted by said radiation-transmissive portions.

2. An alignment device as claimed in claim 1, characterized in that the order diaphragm is also provided with radiation-transmissive portions which transmit alignment beam portions diffracted in the first order by the first alignment mark.

3. An alignment device as claimed in claim 1, characterized in that a further order diaphragm is arranged in the path of the alignment beam radiation between the second alignment mark and the detection system, said order diaphragm being provided with radiation-transmissive portions which transmit only alignment beam portions to the detection system which are diffracted by the first alignment mark in one of the even orders, and by the second alignment mark in other orders which are lower than said even orders.

4. An alignment device as claimed in claim 3, characterized in that the further order diaphragm arranged between the second alignment mark and the detection system is also provided with radiation-transmissive portions which transmit only alignment beam portions which are diffracted in the first order by the first alignment mark.

5. An alignment device as claimed in claim 1, characterized in that said even order is the fourth order.

6. An alignment device as claimed in claim 3, characterized in that said other orders are the +2 order and the −2 order.

7. An alignment device as claimed in claim 3, characterized in that said other orders are a first order and a third order.

8. An alignment device as claimed in claim 5, in which the first alignment mark has a grating structure with a grating period p, characterized in that, per grating period, said first alignment mark comprises at least a grating strip having a width of ⅛.p.

9. An alignment device as claimed in claim 8, characterized in that the first alignment mark comprises four grating strips per grating period, while the mutual distance between the first and the second grating strip and that between the third and the fourth grating strip is equal to ⅛.p, and the mutual distance between the second and the third grating strip is equal to ¼.p.

10. An alignment device as claimed in claim 8, characterized in that the first alignment mark has two grating strips per grating period, which strips are mutually spaced apart by ⅝.p.

11. An alignment device as claimed in claim 1, characterized in that each alignment mark has two grating portions, in which the direction of the grating strips of the first portion is perpendicular to that of the grating strips of the second portion.

12. An apparatus for projecting a mask pattern, present in a mask, on a substrate, which apparatus successively comprises a radiation source unit for supplying a projection beam, a mask holder, a projection system and a substrate holder, and is further provided with a device for aligning the mask with respect to the substrate, characterized in that the alignment device is an alignment device as claimed in claim 1, the first object being the substrate, the first object holder being the substrate holder, the second object being the mask, the second object holder being the mask holder.

13. An apparatus as claimed in claim 12, characterized in that the projection beam is a beam of electromagnetic radiation and the projection system is an optical lens system, and in that the imaging system of the alignment device is constituted by the projection lens system.

14. An apparatus as claimed in claim 12, characterized in that the paths of the alignment beam portions selected by the order diaphragm and in connection elements of the projection lens system having a dimension which is considerably smaller than the diameter of the projection lens system in the plane of said correction elements are arranged, each correction element only deflecting and focusing the associated alignment beam portion.

15. An apparatus as claimed in claim 14, characterized in that the correction elements are arranged in the Fourier plane of the projection lens system.

16. An apparatus as claimed in claim 14 characterized in that the order diaphragm has a dichroic layer which is transmissive to the projection beam radiation and non-transmissive to the alignment beam radiation, with the exception of said radiation-transmissive portions, and in that the correction elements are arranged in said portions.

17. An apparatus as claimed in claim 14, characterized in that the correction elements are lenses.

18. An apparatus as claimed in claim 12, characterized in that a radiation deflection element is arranged in the vicinity of a mask alignment mark for directing the axis of symmetry of selected alignment beam portions principally perpendicularly to the plane of the mask, said radiation deflection element being considerably smaller than the cross-section of the projection beam in the plane of said mask.

19. An apparatus as claimed in claim 18, characterized in that the radiation deflection element is constituted by a wedge-shaped body of a material which is transparent to the alignment beam.

20. An apparatus as claimed in claim 12, characterized in that the first alignment mark is a substrate alignment mark and the second alignment mark is a mask alignment mark.

21. An apparatus as claimed in claim 12, characterized in that the first alignment mark is a mask alignment mark and the second alignment mark is a substrate alignment mark.

22. An apparatus as claimed in claim 21, characterized in that a substrate alignment mark is constituted by a phase diffraction grating and a mask alignment mark is constituted by an amplitude diffraction grating.

* * * * *